United States Patent
Marek

(12) United States Patent (10) Patent No.: US 6,605,945 B2
(45) Date of Patent: Aug. 12, 2003

(54) SUPERCONDUCTING NMR RESONATORS WITH MACROSCOPICALLY HOMOGENEOUS SUPERCONDUCTOR DISTRIBUTION

(75) Inventor: Daniel Marek, Moeriken (CH)

(73) Assignee: Bruker Biospin AG, Fällanden (CH)

( * ) Notice: Subject to any disclaimer, the term of this patent is extended or adjusted under 35 U.S.C. 154(b) by 0 days.

(21) Appl. No.: 10/262,868

(22) Filed: Oct. 3, 2002

(65) Prior Publication Data

US 2003/0071623 A1 Apr. 17, 2003

(30) Foreign Application Priority Data

Oct. 11, 2001 (DE) .......................................... 101 50 131

(51) Int. Cl.$^7$ ................................................. G01V 3/00
(52) U.S. Cl. ........................ 324/318; 324/315; 324/309
(58) Field of Search ................................. 324/318, 315, 324/322, 309, 307

(56) References Cited

U.S. PATENT DOCUMENTS

| | | | |
|---|---|---|---|
| 4,563,648 A | 1/1986 | Hill | 324/322 |
| 5,278,503 A | * 1/1994 | Keller et al. | 324/318 |
| 5,565,778 A | 10/1996 | Brey et al. | 324/318 |
| 5,572,127 A | 11/1996 | Wong et al. | 324/318 |
| 5,585,723 A | * 12/1996 | Withers | 324/318 |
| 5,619,140 A | 4/1997 | Brey et al. | 324/318 |
| 6,025,719 A | 2/2000 | Anderson | 324/309 |
| 6,121,776 A | 9/2000 | Marek | 324/318 |

FOREIGN PATENT DOCUMENTS

| | | |
|---|---|---|
| WO | WO 96/39636 | 12/1996 |
| WO | WO 99/24821 | 5/1999 |
| WO | WO 99/24845 | 5/1999 |

* cited by examiner

*Primary Examiner*—Edward Lefkowitz
*Assistant Examiner*—Brij B. Shrivastav
(74) *Attorney, Agent, or Firm*—Paul Vincent

(57) ABSTRACT

An NMR resonator for receiving RF signals at desired resonance frequencies from a measuring sample in a volume under investigation disposed about a coordinate origin (x,y, z=0), with a means for producing a homogeneous magnetic field $B_0$ in the direction of a z axis, wherein superconducting conductor structures are disposed between $z=-|z_1|$ and $z=+|z_2|$ on a surface which is translation-invariant (=z-invariant) in the z direction at a radial separation from the measuring sample, is characterized in that a compensation arrangement is additionally provided on the z-invariant surface, which extends to values of at least $+|z_2|+0.5|r|>z>-|z_1|-0.5|r|$, wherein $|r|$ is the minimum separation between the measuring sample and the compensation arrangement, wherein the compensation arrangement comprises further superconducting conductor structures which are RF-decoupled from the RF resonator, with the conductor structures of the compensation arrangement and of the RF resonator being composed of individual surface sections ("Z-structures") which comprise superconducting structures and are disposed in the z-invariant surface to each extend along the entire length in the z direction of the conductor structures of the compensation arrangement and of the RF resonator, those superconducting structures being disposed such that decomposition of the surface of the Z structures into a plurality of small equally sized surface elements and application of a homogeneous test magnetic field along the surface normal of each surface element for all surface elements which differ only with respect to their z position, induces a magnetic dipole moment of the same strength. In this manner, the disturbing influence caused by magnetization of the superconductor is very well compensated for.

30 Claims, 18 Drawing Sheets

Fig. 9a  Fig. 9b  Fig. 9c
Fig. 9d  Fig. 9e  Fig. 9f

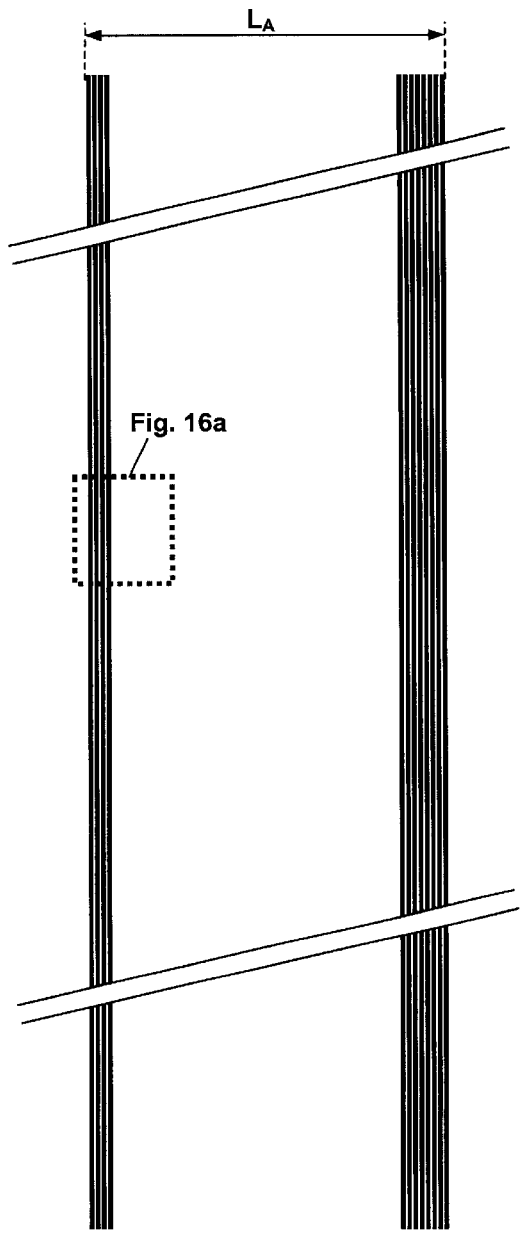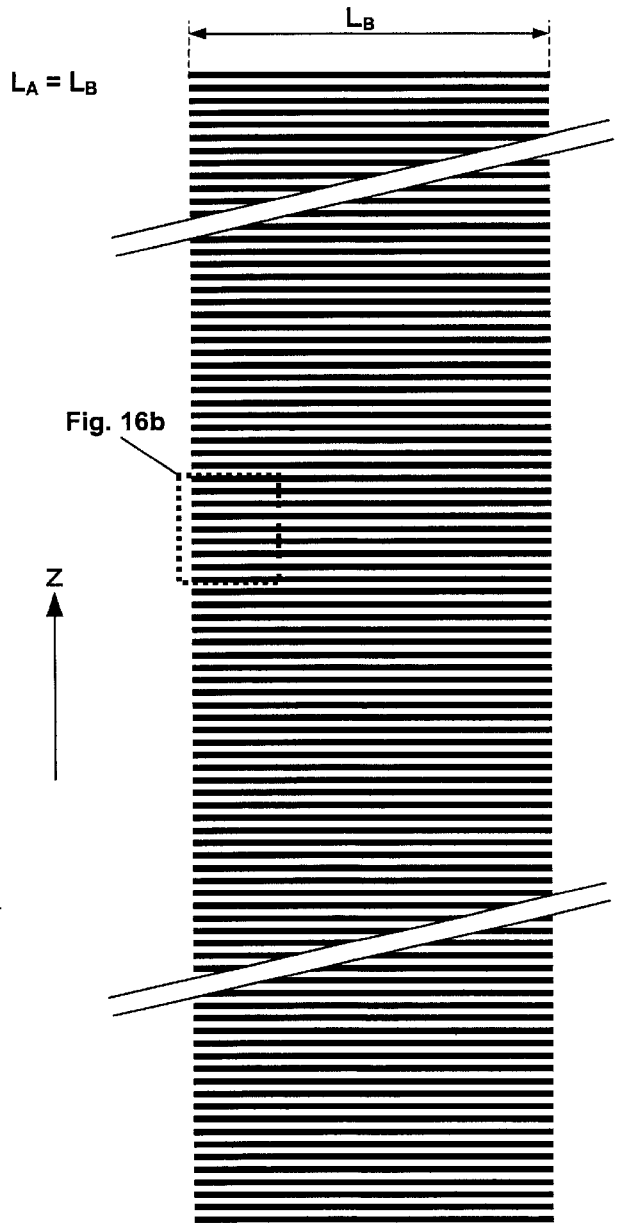
Fig. 14a                    Fig. 14b

SUPERCONDUCTING NMR RESONATORS WITH MACROSCOPICALLY HOMOGENEOUS SUPERCONDUCTOR DISTRIBUTION

This application claims Paris Convention priority of DE 101 50 131.5 filed Oct. 11, 2001 the complete disclosure of which is hereby incorporated by reference.

BACKGROUND OF THE INVENTION

The invention concerns an NMR (nuclear magnetic resonance) resonator device with at least one RF (radio frequency) resonator for emitting and/or receiving RF signals at one or more desired resonance frequencies to and/or from a measuring sample in an investigational volume, disposed about a coordinate origin (x,y,z=0), of an NMR apparatus with a means for producing a homogeneous magnetic field $B_0$ in the direction of a z axis, wherein superconducting conductor structures of the RF resonator, which act inductively and partially also capacitively, are disposed between $z=-|z_1|$ and $z=+|z_2|$ substantially on a surface which is translation-invariant (=z-invariant) in the z direction at a radial (x,y) separation from the measuring sample.

An arrangement of this type is known from U.S. Pat. No. 5,585,723.

The present invention concerns the field of high-resolution nuclear magnetic resonance (NMR), in particular a configuration of superconducting resonators for receiving the NMR signal from the NMR measuring sample.

Although NMR is a very useful method for structure analysis of chemical compounds, it is not very sensitive. To increase the sensitivity, according to current prior art, cooled normally conducting and in particular superconducting resonators are used which considerably increase the S/N ratio. [1] describes e.g. such resonators.

The main problem with the use of superconductors for the production of NMR resonators is their static magnetization. In a superconductor of type II, this magnetization is produced by induced currents which flow in closed paths within the superconductor and which depend on the history of the superconductor [2]. These currents can produce strong disturbances in the homogeneous field of the active region of the measuring sample which cause distortion of the resonance lines in the NMR spectrum. As long as the external conditions remain unchanged, these currents continue to flow for a nearly unlimited length of time due to the zero resistance of the superconductor.

Methods ([2], [3], [4]) for minimizing this magnetization have been published. They are all complicated and have further disadvantages which are described below. Superconducting coil arrangements have also been described [5] which minimize their disturbing fields through limitation of the active measuring region using normally conducting connecting elements. These coil arrangements [5] are superior to the above-mentioned solutions of methods [1–3] with respect to fill factor and attainable RF field strengths, but have the disadvantage that the Q-value of the RF resonator is significantly reduced by the normally conducting components which must be used.

The known measures for minimizing the influence of magnetization are:
1. Division of the width of the superconductor into n individual longitudinal strips ([1], [5]), wherein n should be as large as possible. This reduces the maximum currents which can flow in these longitudinal strips and therefore also the maximum possible magnetization of the superconductor by the factor n.
2. Prevent magnetization completely by first cooling the superconductor when it is positioned in the static field of the magnet. Patent [4] additionally recommends slow cooling.
3. Largely eliminate existing magnetization by means of a demagnetization process ([2], [3]). This is achieved by a sequence of decreasing transverse magnetic fields which act on the superconductor. A current structure with opposite current regions is thereby induced in the superconductor, with the sum of the individual magnetic field contributions cancelling to a good approximation.

These known methods have significant disadvantages:
1. Although the measure described in 1 considerably reduces magnetization, the remaining residual magnetization is generally still too high for adequate performance in high-resolution NMR applications.
2. The methods described in 2 and 3 can function satisfactorily only when the position of the superconductor with respect to the static magnetic field remains exactly the same during the entire measuring process and when the static magnetic field itself also remains unchanged during this period. The principal problem is the constancy of the angular position which is usually insufficient in practice. A tilting of merely 0.1 degrees relative to the static magnetic field can produce shielding currents in the superconductor of such a strength that the field homogeneity is deteriorated to an unacceptable degree.

Tilting causes an additional transverse magnetic flux to be directed from the static magnetic field onto the surface of the superconductor, and since the superconductor tries to maintain the previously existing flux, it counteracts with additional surface currents such that the total flux through the superconductor once more corresponds to the original value. These surface currents produce an inhomogeneous field at the location of the measuring sample thereby unduly deteriorating the required spectral resolution.
3. The methods ([2], [3], [4]) are difficult to carry out and require additional devices in the critical region of the NMR resonator.

In contrast thereto, it is the object of the present invention to present a new type of superconducting NMR resonator having additional superconducting conductor structures which are optimally decoupled from the actual RF resonator and which optimally compensate for the disturbing influence produced by magnetization of the superconductor.

SUMMARY OF THE INVENTION

This objective is achieved in accordance with the invention in an NMR resonator having the above-described features in that an additional compensation arrangement is provided on the z-invariant surface, which extends to values of at least $z<-|z_1|-0.5|r|$ and $z>+|z_2|+0.5|r|$, wherein $|r|$ is the minimum separation between the measuring sample and the compensation arrangement, with the compensation arrangement comprising further superconducting conductor structures which are largely RF-decoupled from the RF resonator, wherein the conductor structures of the compensation arrangement and of the RF resonator are composed of individual surface sections ("Z-structures") which comprise superconducting structures and which are disposed in the z-invariant surface to each extend across the entire length in the z direction of the conductor structures of the compensation arrangement and of the RF resonator and whose superconducting structures are disposed such that, with suitable conceptual decomposition of the surface of the Z structures into a plurality of small equally sized surface elements and with conceptual application of a homogeneous test magnetic field along the surface normal of each surface element, a magnetic dipole moment of essentially the same strength would be induced in all surface elements which differ only with respect to their z position.

The inventive resonators have many advantages:

the complicated methods ([2], [3], [4]) for demagnetisation of the superconductor are no longer required.

external disturbing fields and mechanical motion of the resonator relative to the static magnetic field produce a magnetization in the superconductor which has only minimal influence on the homogeneity of the static magnetic field in the active region of the measuring sample due to the above-mentioned compensation. This is also true when the superconductor is highly magnetized.

known coil structures [5] can be designed much more freely and therefore more effectively.

In the inventive resonator, the individual superconducting conductor parts which carry the radio frequency (RF) current and which therefore form the RF resonator are supplemented by additional superconducting conductor parts which are disposed quasi continuously within the RF resonator, which extend beyond same in the z direction and which are, to the extent possible, RF-decoupled from the RF resonator such that they do not carry RF current. FIG. 12b shows an arrangement built according to this principle, wherein the RF resonator is shown with hatched lines and the additional conductor parts, which merely serve to homogenize the $B_0$ field in the active measuring region, are shown in black. Clearly, the superconducting material is distributed fairly homogeneously across the entire RF resonator surface and the additional conductor parts which generally leads to a uniform distribution of the dipole moments over the entire surface. This uniform distribution of the dipole moments which are produced by currents induced in the superconductor, produces a nearly homogeneous disturbing field in the measuring volume and can therefore no longer have a significant influence on the NMR spectrum.

The entire resonator is preferably assembled from conductor sections of minimum width (FIG. 17a) i.e. the minimum width possible using the lithographic production method, wherein these conductor sections can also be disposed in bundles (FIGS. 17b, 16c, 16d).

The magnetization currents in the superconductor and the field disturbances produced by them are thereby minimized in the active measuring region.

Conductor sections which are horizontally oriented, not bundled and disposed in the z direction with periodic continuity (FIG. 17a) have a higher periodicity in the z direction than they would have were they bundled (FIG. 17b). In the former case, magnetization of the superconductor therefore produces a field disturbance in the active measuring region which is smaller than in the latter case (see also FIG. 8). Bundling of the individual conductor sections can still be advantageous for constructive reasons, in particular for generating the capacitive portion of the RF resonator.

The terms transverse field, longitudinal field, NMR resonator, RF receiver coil arrangement, and RF resonator will be mentioned several times in the following description and are therefore defined in detail below:

a transverse field is a field which is oriented perpendicular to the static magnetic field $B_0$, a longitudinal field is parallel to $B_0$.

an NMR resonator refers to the entire resonator arrangement. It is composed of one or more, preferably 2 or 4 RF receiver coil arrangements which are disposed around the measuring volume and which are RF-coupled to one another. The RF receiver coil arrangement itself comprises the RF resonator and the compensation arrangement, wherein the RF resonator substantially represents that part of the RF receiver coil arrangement which carries the RF current.

Different embodiments will be defined below taking into consideration the above definitions.

In one particularly preferred embodiment of the inventive RF receiver coil arrangement, all surface elements which differ only with respect to their z position, contain substantially the same amount of superconducting material. This facilitates design of the surface elements such that the desired RF and magnetic properties are approximately obtained in a simple manner.

Smaller constituent elements of the superconducting structure permit a finer subdivision of the overall surface of the RF receiver coil arrangement into identical, small surface elements having as equal dipole moments as possible. The smallest dimension of these surface elements must not be less than the smallest dimension of the structural elements, since individual surface elements could otherwise fail to contain any superconductor at all thereby violating the condition of identical dipole moments per surface element. An as fine as possible surface division is required to minimize the waviness of the disturbing field in the active measuring region produced by the magnetic dipole moments of the superconducting material in the individual surface elements. Reasonably fine division can be obtained when the total number of the surface elements is larger than 50, preferably larger than 200.

The most important aspect of this divisioning is the number of identical surface elements which differ only with regard to their z position, i.e. disposed on strips oriented parallel to the z axis. This number should be larger than 20 and preferably larger than 50.

In one particularly preferred embodiment of the inventive RF receiver coil arrangement, the superconducting conductor structures of the compensation arrangement project past both sides of the RF resonator by at least half, preferably approximately twice, the extension of the RF resonator in the z direction. The edge regions of the compensation arrangement which are mainly responsible for the disturbing influences in the active measuring region are thereby spatially moved as far from the active measuring region as possible to preclude significant influence at that location.

NMR resonators are usually composed of several RF receiver coil arrangements in order to optimise the fill factor. In an advantageous embodiment of the invention, the NMR resonator therefore contains several coupled RF receiver coil arrangements, preferably 2 or 4 on different partial regions of the z-invariant surface.

In one embodiment of the invention which is particularly simple with respect to geometry and production, the superconducting conductor structures of the RF resonator(s), which act inductively and partially also capacitively, and the superconducting conductor structures of the compensation arrangement(s) are both disposed on flat substrate elements which are oriented parallel to each other and to the z axis.

In one embodiment of the inventive RF receiver coil arrangement which is particularly simple to produce, the superconducting conductor structures of the RF resonator, which act inductively and partially also capacitively, and the superconducting conductor structures of the associated compensation arrangement are disposed in the same plane. This and the previous embodiment function optimally when the working point remains in the linear region of the magnetization curve, i.e. when the magnetization of the superconductor is not too large. Specially selected e.g. zig-zag shaped conductor structures also permit optimum function outside of the linear region.

An alternative embodiment is characterized in that the superconducting structures of the RF resonator and of the associated compensation arrangement are disposed in two or more flat partial surfaces which are arranged parallel to each other, wherein the superconducting conductor structures of the RF resonator, which act inductively and partially also capacitively, and parts of the associated superconducting conductor structures of the compensation arrangement are disposed in the first partial surface and the remaining parts of the superconducting conductor structures of the compensation arrangement are disposed in the further partial surfaces. This somewhat complicated arrangement produces a further physical degree of freedom which permits very precise compensation of the disturbing influences caused by the magnetism of the superconductor, wherein optimum results can also be achieved when the working point is outside of the linear region of the magnetization curve.

In a further development of this embodiment, the separations between the partial surfaces, measured in a direction perpendicular to the partial surfaces are not more than 600 $\mu$m, preferably between 50 and 200 $\mu$m. These separations must be kept as small as possible to minimize magnetism compensation errors.

In an embodiment of the inventive RF receiver coil arrangement allowing fill factors which are even higher than in the flat arrangement, the superconducting conductor structures of the RF resonator(s), which act inductively and partially also capacitively, and the superconducting conductor structures of the compensation arrangement(s) are disposed on flat substrate elements which are cylindrically curved about the z direction. This, however, makes production much more difficult.

One simple embodiment of the invention is particularly preferred wherein the conductor structures of the compensation arrangement and of the RF resonator are disposed on the same partial region of the z-invariant surface. A plurality of further embodiments, which are characterized by their simple construction, can be derived from this embodiment.

In a further particularly preferred very simple embodiment of the invention, at least part of the superconducting sections of the conductor structures is disposed like strips which are either parallel or perpendicular to the z axis. This embodiment has a simple geometrical shape and serves as a starting point for the production of different z structures.

In one embodiment which increases variation options, the superconducting structures on the z-invariant surfaces have different geometric shapes, e.g. strips of different orientation and width and squares, circles, trapezoids etc. This increases the flexibility for design of the overall geometry to further optimise error compensation.

A very useful Z structure which can be used individually or multiply in an inventive RF receiver coil arrangement consists of identical, narrow superconducting structural elements which are formed of one individual conductor or of conductors disposed in groups which are disposed at close intervals, periodically and continuously in the z direction, wherein the separation between neighboring structural elements is small compared to the separation from the center of the investigational volume.

In a further very useful Z structure which can be applied individually or multiply in an inventive RF receiver coil arrangement, structural elements having one individual conductor or conductors disposed in groups have conductor sections which are oriented parallel to the z axis and which have identical or different mutual separations.

An alternative embodiment of the Z structure which can be used individually or multiply in an inventive RF receiver coil arrangement is characterized in that it is divided into several, preferably rectangular partial regions whose width equals the width of the Z structure and that these partial regions are filled by straight superconducting strips which are inclined at a desired angle with respect to the z axis, wherein this angle is either positive or negative within a partial region, and the inclined strips are disposed within a partial region at close intervals, periodically, and continuously in the z direction, wherein the separation between neighboring strips is small compared to the separation from the center of the volume under investigation, and the inclined strips continuously merge into one another at the border lines between the partial regions. This Z structure has a more complicated construction but is advantageous in that it lies on one single surface and offers perfect compensation even when the superconductor is magnetized to such an extent that its working point is outside of the linear region of the magnetization curve.

In one embodiment of the inventive RF receiver coil arrangement, the superconducting conductor structures which do not belong to the RF resonator contain a number of narrow interruptions which are distributed over parts or over the entire length of the individual superconducting conductor sections. This considerably improves RF decoupling between the RF resonator and the compensation arrangement since the eddy currents which are usually produced in the conductor structures are minimized or suppressed by the interruptions.

In a further embodiment of the invention, the RF resonator is produced from the desired regions of the Z structures in that the superconductor or parts thereof is/are rotated or displaced within small surface elements of the Z structures, and/or narrow separations between the conductors are connected in a superconducting fashion and/or narrow interruptions are introduced in the conductors and/or inclined and zig-zag shaped Z structures are used and/or the Z structures are distributed over two or more partial surfaces.

A very concrete, particularly preferred embodiment which has a relatively simple geometrical structure is characterized in that the RF receiver coil arrangement is formed of three Z structures, two with vertical strips on the left and on the right and one with horizontal straight strips in the middle.

Other possible geometric arrangements result from embodiments wherein the RF receiver coil arrangement is formed of three Z structures, two with inclined partially zig-zag shaped transverse strips on the left and on the right and an intermediate structure with transverse strips disposed periodically in the z direction. The construction of this embodiment is more complicated but is advantageous in that it lies on one single surface and provides perfect compensation even when the magnetization of the superconductor is sufficiently strong to drive its working point outside of the linear region of the magnetization curve.

In another embodiment of the invention which provides very exact compensation and many variation possibilities, the entire RF receiver coil arrangement is disposed in two planes and is composed of three Z structures, i.e. of a first and second structure with strips arranged parallel to the z axis at a defined mutual separation and a third structure with strips disposed periodically in z and transverse to the z axis, wherein the third Z structure is positioned above the first two structures and precisely covers these, wherein the RF resonator and the compensation structure are generated in that the three Z structures are partially decomposed and distributed on two separate partial surfaces which belong to one or two substrates, wherein the first partial surface contains the entire RF resonator with the main part of the compensation structure and the second partial surface contains the remaining part of the compensation structure, and the structures produced in this fashion are positioned on top of each other on the two partial surfaces such that the sum of their structures is once more equal to the sum of the original three Z structures thereby producing an operative NMR resonator.

In further preferred embodiments of the invention, at least parts of the superconducting conductor structures can contain high temperature superconducting (HTS) material. Conductors of HTS material produced in the epitaxial method have very high critical current densities with very high field strengths in the temperature range of approximately 4.2 K to 30 K, which is generally used for superconducting NMR resonators, and are therefore highly suitable for producing NMR resonators.

Finally, one embodiment of the invention is also advantageous wherein the superconducting conductor structures are formed from thin layers, preferably of a thickness of between 0.1 and 1 $\mu$m which is within the scope of conventional production technology.

Further advantages can be extracted from the drawing and the description. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and explained in more detail by means of embodiments.

BRIEF DESCRIPTION OF THE DRAWING

FIG. 9a shows a superconducting strip parallel to the $B_0$ field.

FIG. 9b shows a superconducting conductor structure which is composed of several uniformly distributed strips which are all parallel to the $B_0$ field.

FIG. 9c shows a superconducting conductor structure which is composed of several uniformly distributed strips which are all perpendicular to the $B_0$ field.

FIG. 9d shows a superconducting conductor structure which is composed of strips disposed at an inclination with respect to the $B_0$ field.

FIG. 9e is a mirror image of the superconducting conductor structure of FIG. 9d.

FIG. 9f is a superconducting conductor structure which is composed of sections of the conductor structures of FIG. 9d and its mirror image of FIG. 9e.

FIG. 14a shows the two vertical conductor structures from which part of the fourth embodiment of an inventive resonator is produced.

FIG. 14b shows the horizontal conductor structure from which part of the fourth embodiment of an inventive resonator is produced.

DESCRIPTION OF THE PREFERRED EMBODIMENT

The function of the inventive embodiments is explained below.

Figure 7:
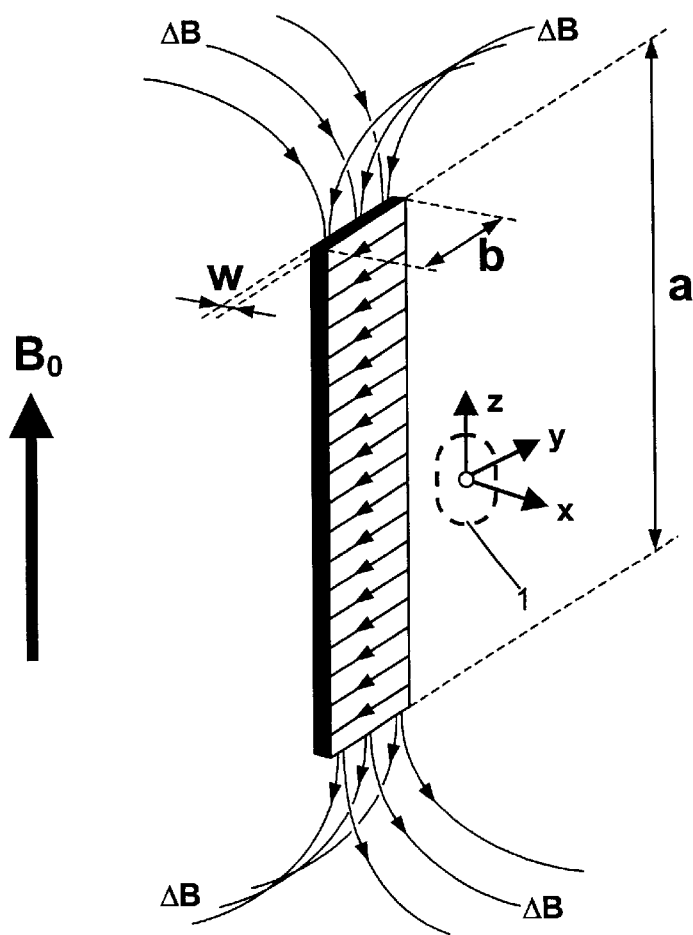
FIG. 7 shows the disturbing field $\Delta B$ which is produced by the longitudinal magnetization of a superconducting strip which is oriented parallel to the $B_0$ field. Disturbing fields are generated only at the two ends of the strip.

A superconducting strip which is oriented exactly parallel to the $B_0$ field and was never exposed to another field has only one longitudinal magnetization (FIG. 7). $B_z$ components are produced only at the two ends of the strips and are negligibly small in the central region of the strip.

The longitudinal magnetization can be represented by tightly abutting closed current loops which surround the thin superconducting strip of square cross-section. The length and width of the square cross-section equals the width b or the thickness w of the strip. Since the thickness w of the superconductor is extremely small (approximately 0.1 to 1 μm) the cross-sectional surface (b·w) is also extremely small and the disturbing field produced is therefore negligibly small.

If the superconductor were magnetized only in the longitudinal direction, the magnetization problems with NMR applications could be neglected. The slightest inclination of the strip relative to the $B_0$ field causes the superconductor to produce transverse magnetization. Since the $B_0$ field is extremely strong, even inclinations of less than 0.1 degrees are sufficient. This can be represented by closed current loops which flow on the surface of the superconducting strip (FIG. 2) and which try to compensate for the changed magnetic flux through the superconductor. This compensation works exactly only until the currents in the loops have reached the critical current i.e. the largest possible superconducting current in the superconductor.

Since the surface area available to closed current loops of transverse magnetization is much larger than that of the longitudinal magnetization, their influence on the NMR spectrum can be orders of magnitude larger. It is therefore the aim of the present invention to minimize the influence of this transverse magnetization on the $B_0$ homogeneity in the active measuring region. Reference to magnetization of the superconductor below means transverse magnetization.

The following seven findings have substantially lead to the present invention and are used in the following order:
1. Only the field components parallel to the static field $B_0$ must be taken into consideration.

In NMR spectroscopy, the resonance frequency depends on the absolute magnitude of the magnetic field at the location of the measuring sample:

$$|B|^2 = (B_0 + \Delta B_z)^2 + \Delta B_x^2 + \Delta B_y^2 = (B_0 + B_z)^2 + \Delta B_{XY}^2$$

As long as the disturbing components $\Delta B_x$, $\Delta B_y$, $\Delta B_z$ are small compared to the static magnetic field $B_0$, one obtains the following approximation for the relative homogeneity (the z axis is taken to be parallel to $B_0$):

$$|B|/B_0 \approx 1 + \Delta B_z/B_0 + \tfrac{1}{2}(\Delta B_{xy}/B_0)^2$$

One will recognize immediately that only the component $\Delta B_z$ which is parallel to the field $B_0$ has a strong influence on the relative homogeneity. The component $\Delta B_{xy}$ which is perpendicular to $B_0$ has an influence which is orders of magnitude smaller.

In high-resolution NMR, the relative field error ($\Delta B_z/B_0 + \tfrac{1}{2}(\Delta B_{xy}/B_0)^2$) can be of an order of magnitude of $10^{-10}$ to $10^{-11}$ which produces the following allowable limits for $\Delta B_z/B_0$ and $\Delta B_{xy}/B_0$:

$$\Delta B_z/B_0 < 10^{-10} \text{ to } 10^{-11}$$

$$\Delta B_{xy}/B_0 < 10^{-5} \text{ to } 10^{-6}.$$

The disturbing component $\Delta B_z$ which is produced by the magnetization of the superconductor and which is parallel to $B_0$ therefore has an influence on the NMR spectrum which is larger by approximately 5 orders of magnitude than the component $\Delta B_{xy}$ which is perpendicular to $B_0$.

Generally, only very thin layers of superconducting material are used for NMR resonators and therefore the required condition ($\Delta B_{xy}/B_0 < 10^{-5}$ to $10^{-6}$) can be easily met. In summary, this means that for observing the homogeneity only the z component $\Delta B_z$ of the disturbing field must be taken into consideration. The other two components $\Delta B_x$ and $\Delta B_y$ can be safely neglected.

2. Currents parallel to the z axis can be neglected.

Currents which flow parallel to the z axis, i.e. parallel to the static magnetic field $B_0$ cannot produce any $B_z$ components according to the Maxwell equations and can therefore be neglected. However, currents which are directed perpendicular to the static magnetic field, e.g. currents which flow in an x-y plane, can produce $B_z$ components and must therefore be taken into consideration.

Figure 2:
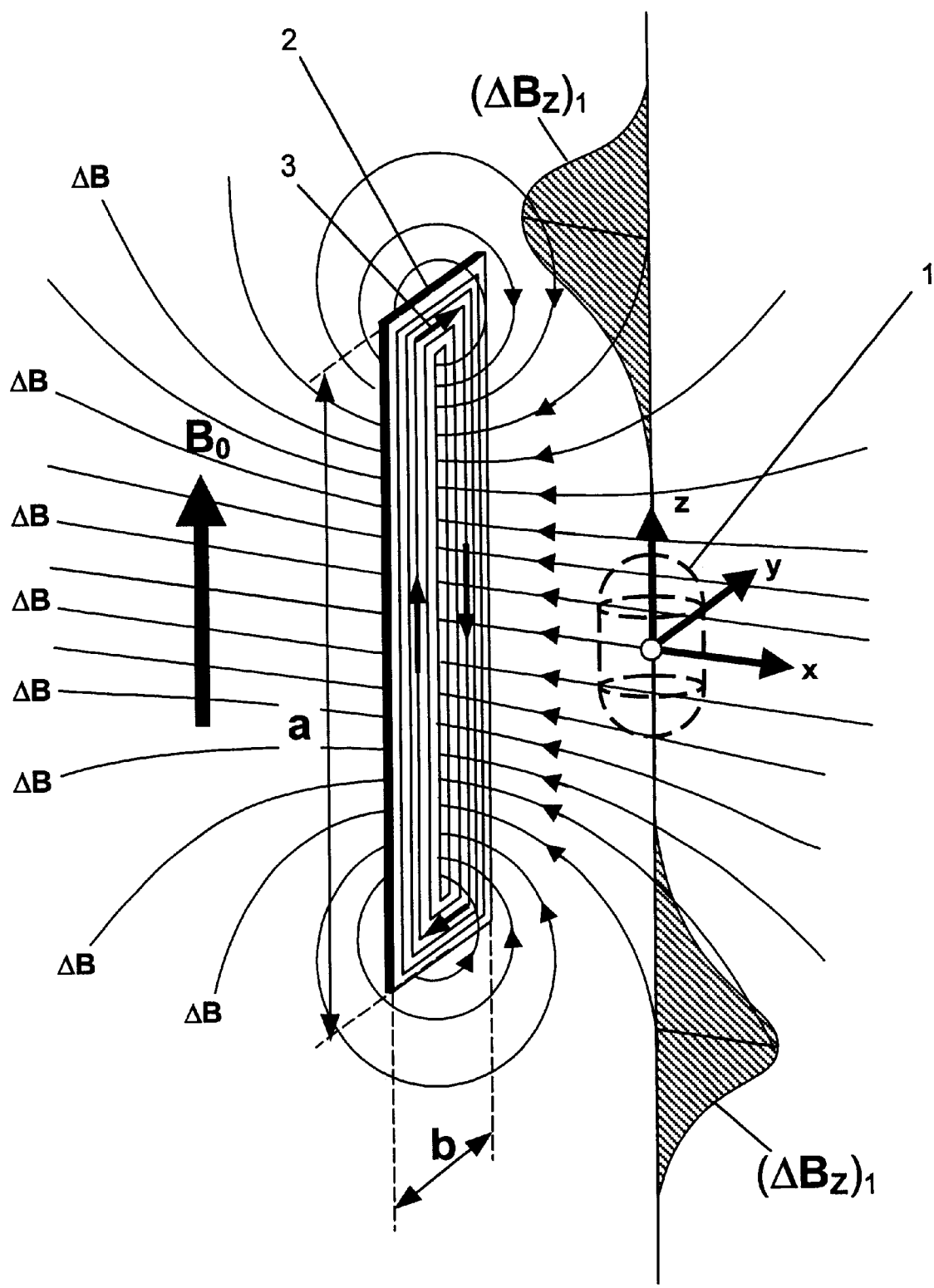
FIG. 2 is a perspective view of the field $\Delta B$ which is produced by a magnetized superconducting strip whose longitudinal axis is parallel to $B_0$.
Figure 3:
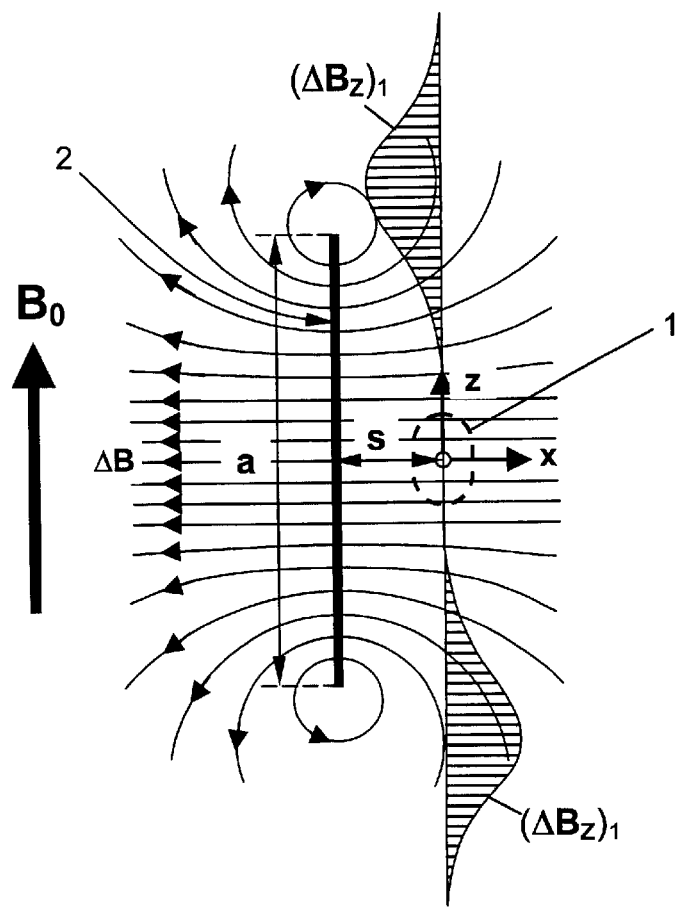
FIG. 3 corresponds to FIG. 2, however shown in the xz plane. The z component $(\Delta B_z)_1$ of the field $\Delta B$ is practically zero in the region of the active measuring volume and appears only at the upper and lower edge of the strip.

3. Superconducting strips parallel to the static magnetic field $B_0$ produce $B_z$ components at their two ends only A very thin superconducting strip of length a, width b and thickness w, wherein b<<a and w<<b having a longitudinal axis parallel to the z axis, only has currents which flow perpendicularly to the z axis, and which thereby produce $B_z$ components (FIGS. 2 and 3), at the two ends of the strip, wherein the currents flow perpendicular to the z axis and thereby produce $B_z$ components (FIGS. 2 and 3). When the strip is sufficiently long i.e. if a is large compared to the separation s (FIG. 3) between the strip and center of the measuring volume, the ends are far away from the active measuring volume and can therefore no longer significantly influence the $B_z$ homogeneity in the measuring volume. The strip remains magnetized and can even be magnetized up to its maximum value given by the critical current of the superconductor. Its influence on the $B_z$ homogeneity nevertheless remains small.

4. Superconducting strips which are oriented either perpendicular or inclined to the static magnetic field $B_0$ but are periodically and continuously repeated in the direction of the $B_0$ field over a long distance have a homogeneous structure which is stretched in the z direction to only produce $B_z$ components at its two ends.

Figure 5:
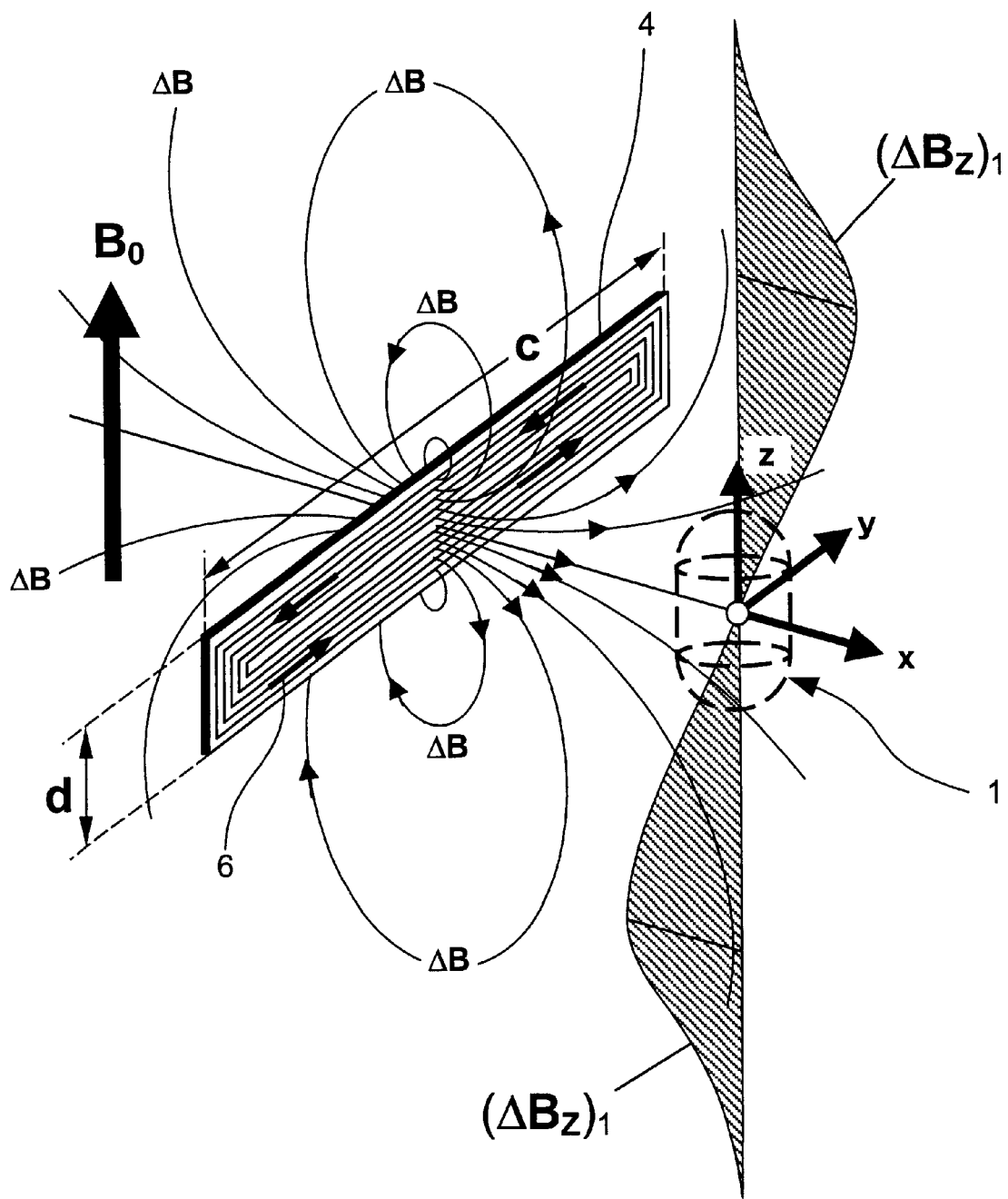
FIG. 5 is a perspective illustration of the field $\Delta B$ which is produced by a magnetized superconducting strip whose longitudinal axis is perpendicular to $B_0$.
Figure 6:
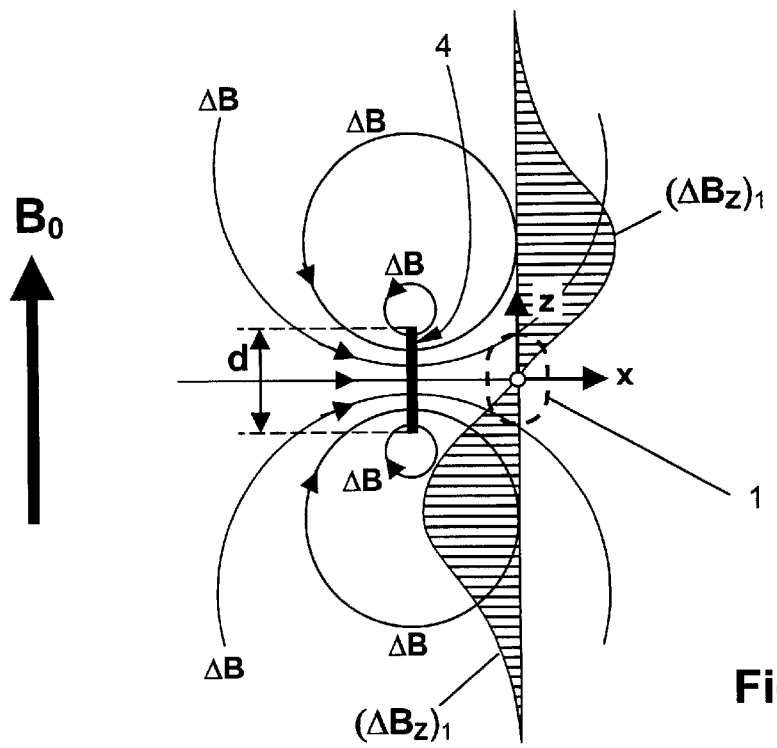
FIG. 6 corresponds to FIG. 5, however shown in the xz plane. The $B_z$ component $(\Delta B_z)_1$ of the field $\Delta B$ shows strong inhomogeneities at the location of the active measuring sample which can have a strong influence on the NMR resonance lines.

A superconducting strip of length c and width d, wherein d is small compared to c, and having a longitudinal axis perpendicular to the z axis has substantial current components which flow perpendicularly with respect to the z axis, thereby producing $B_z$ components (FIGS. 5 and 6). These currents can greatly disturb the $B_z$ homogeneity in the active measuring volume.

Figure 8:
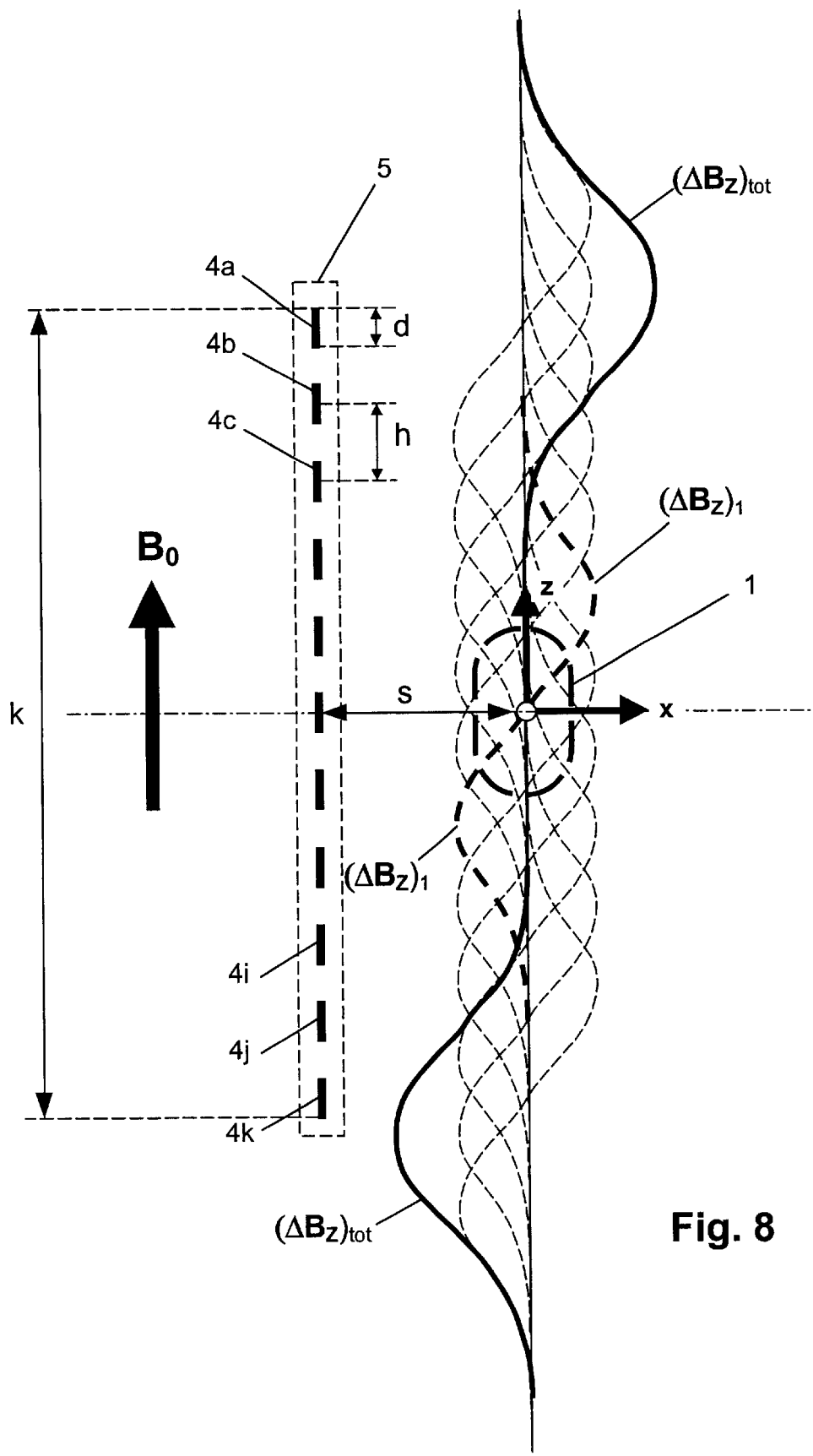
FIG. 8 shows an arrangement of several superconducting strips 4a, 4b, 4c, ..., 4k which are on a plane parallel to $B_0$ and are uniformly disposed on top of each other. The $B_z$ components $(\Delta B_z)_1$ of the individual strips overlap and produce the field $(\Delta B_z)_{tot}$. It is practically zero in the region of the active measuring volume 1 and $B_z$ components are present only at the upper and lower ends of the arrangement.

If a large number of such strips are uniformly disposed in the z direction such that a sufficiently long periodical, continuous structure is produced (FIG. 9c), practically no z components are present in the central region of the strip structure. FIG. 8 shows an example of a strip structure with 11 such strips which are disposed on top of each other at equal separations on a plane parallel to the z axis. As long as the separation h between the strips is small compared to the separation s between the strip structure and the center of the active measuring volume and as long as the length k of the strip structure in the z direction is large compared to the separation s, the z inhomogeneities produced by the individual strips nearly fully compensate each other in the region of the active measuring volume and a very homogeneous volume with acceptably small irregularities is produced at that location. Larger $B_z$ inhomogeneities are only present at the upper and lower ends of the strip structure.

This latter result not only obtains for strips oriented perpendicular to the z axis (FIG. 9c) but also for those which are inclined with respect to the z axis (FIGS. 9d, 9e) or for any other structure which is periodic in the z direction.

5. If superconducting portions are rotated or displaced within small surface elements, the magnetic field produced by them remains nearly unchanged at the location of the active measuring region.

Any superconducting structure on a flat substrate can be divided into a network of equal square surface elements whose side length is small compared to the separation from the center of the active measuring region.

The superconductor in the individual surface element is assumed to be magnetized and have transverse magnetization. It is produced by closed current loops in the superconductor and since the geometric dimensions of these current loops are small compared to the separation from the center of the active measuring region they may be replaced altogether by a magnetic dipole which will be referred to as a substitute dipole. The substitute dipole produces nearly the same field in the active measuring region as the associated current loops.

The superconductor in the individual surface element can now be rotated and displaced and even its geometrical shape can be changed without changing the field in the active measuring region, the sole condition being that the substitute dipole remains the same after these changes.

6. The influence of occasional, narrow interruptions in the superconducting strips can be neglected.

Occasional interruptions in the superconducting strips have no noticeable influence on the z homogeneity in the active measuring region. An interruption can be replaced by current loops which flow opposite to the normal current loops in the superconductor. They are confined to a very small area and therefore can only produce a very small field.

7. A superconducting conductor structure and its reflection about a plane which is parallel to the static magnetic field $B_0$ have identical magnetic behavior.

If a superconducting conductor structure is reflected about a plane, which is parallel to the z axis, all angles relative to the z axis and therefore relative to the $B_0$ field are maintained and therefore the critical current density and current distribution in the superconductor are unchanged.

The conductor structures of FIGS. 9d and 9e are therefore magnetically identical and since FIG. 9f is composed of both conductor structures it is also largely magnetically identical to FIGS. 9d and 9e.

Fortunately, the NMR spectrum depends only on the $B_z$ component in the active measuring region (finding 1) which results from transverse magnetization. With a long superconducting strip parallel to the $B_0$ field, z components appear only at the two ends of the strip which, however, are negligibly small in the active measuring region (FIG. 2). This is due to the fact that the current directions in the closed current loops of the superconductor which are parallel to the $B_0$ field in the region of the sample 1, are transverse to the $B_0$ field at the ends of the strips. As was shown above under finding 2, currents parallel to the $B_0$ field produce no z components and are therefore harmless.

Figure 4:
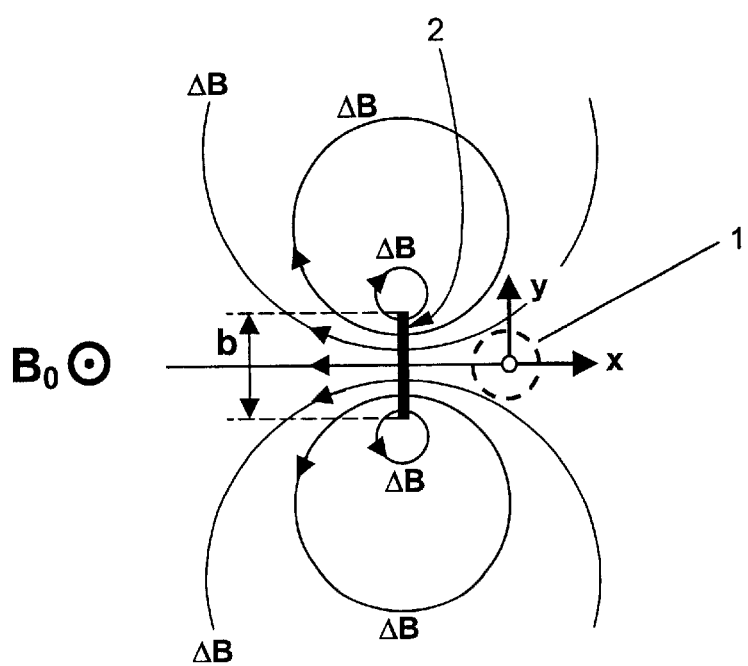
FIG. 4 shows the field $\Delta B$ of the arrangement of FIG. 2 in the xy plane. Strong field inhomogeneities are present at the location of the active measuring sample 1 which are caused by the $\Delta B_x$ and $\Delta B_y$ components. However, these have no influence on the NMR spectrum and can therefore be neglected.

FIG. 4 clearly shows what would happen if the NMR spectrum was also dependent on the x and y components of the transverse magnetization. Strong inhomogeneities are clearly present in the active measuring region 1 which could strongly influence the NMR spectrum. The present invention can be realized in practice only due to the fact that NMR graciously requires consideration of the $B_z$ components only.

A superconducting strip which is transverse to the direction of the $B_0$ field (FIG. 5) fundamentally produces z components since a large portion of the currents flow transverse to the direction of the $B_0$ field. It is nevertheless possible to effectively use these strips (finding 4). The only condition is that these strips are repeated periodically and continuously in the z direction (FIG. 9c) thereby producing a sufficiently long conductor structure in the z direction. If this is the case, the fields which are produced by the transverse currents mutually compensate in the central region of the conductor structure, i.e. in the active measuring region, and z components are produced only at the upper and lower ends of the conductor structure where compensation is incomplete (FIG. 8).

These findings show that conductor structures whose width is constant and whose length is large compared to the active measuring region and which have a longitudinal axis oriented parallel to the $B_0$ field and a distribution of the superconducting parts which is macroscopically homogeneous in the z direction, only produce $B_z$ components at the upper and lower ends of the conductor structures but practically none in the central region where the measuring sample is located. These conductor structures must be sufficiently long that the fields produced at the ends generate a negligibly small disturbing field in the active measuring region.

A distribution of the superconducting parts which is macroscopically homogeneous in the z direction can be obtained by dividing the surface of the conductor structure into a grid of identical square surface elements whose side length is small compared to the separation from the center of the active measuring region, wherein the superconductors are distributed on the individual surface elements such that their transverse magnetization in each surface element can be replaced by magnetic dipoles of as equal strengths as possible. This can produce conductor structures which are composed e.g. of different geometrical shapes, e.g. of strips having different orientations and widths and of squares, circles, trapezoids etc. without these conductor structures producing disturbing fields in the active measuring region. A macroscopically homogeneous distribution of the superconducting parts in the z direction can also be obtained in that these parts consist of identical narrow conductor sections which are disposed close to each other and which are periodical and continuous. The conductor sections must be sufficiently close to each other that the waviness of the disturbing field produced by them is negligibly small in the active measuring region. FIGS. 9c, 9d and 9e show examples of such conductor structures.

The superconducting components must not necessarily be identical, rather can be supplemented with their mirror-symmetrical images as shown in the example of FIG. 9f and explained in more detail above under finding 7.

Moreover, it should be noted that in the special case when the superconducting parts consist of narrow straight conductor sections which are oriented parallel to the $B_0$ field, they must not exhibit periodic and continuous sequences but can have any separation from each other since none of the individual conductor sections itself produces a $B_z$ field in the active measuring region.

These latter conductor structures will be referred to as Z structures. The present invention is based on several such Z structures which are disposed close to each other and/or on top of each other, and constructs a desired RF resonator from a certain region of these conductor structures. The remaining portions of these conductor structures only contribute to compensation of magnetism of the superconductor and, in the ideal case, should not carry any RF current. RF current should only flow in the RF resonator and it must therefore be optimally RF-decoupled from the other conductors. To construct the RF resonator from the Z structures, individual selected small-surface conductor parts are rotated or displaced according to finding 5 and individual conductor sections are connected or disconnected.

The remaining part of the Z structure which does not belong to the RF resonator can also be modified according to finding 5 wherein e.g. vertical conductor arrangements can be changed into horizontal arrangements to thereby reduce RF coupling to the RF resonator.

For reasons of completeness, the following two points must be mentioned with reference to the Z structures:
1. The Z structures do not have to be disposed in one plane, they can be realized on any surface which is invariant in z, in particular also on cylindrical surfaces.
2. The Z structures must have a constant width across z, however, do not have to be rectangular, i.e. the two terminals at the ends of their longitudinal extension can have any desired shape, e.g. be inclined or curved. Since these ends are far away from the active measuring region, they have no influence on the field homogeneity in the measuring region.

The above described principles permit a large number of possible embodiments, only several of which will be described. All of the following embodiments are based on three Z structures only, two with vertical (parallel to the z axis) or inclined conductor sections and one with horizontal (perpendicular to the z axis) conductor sections.

Figure 10A:
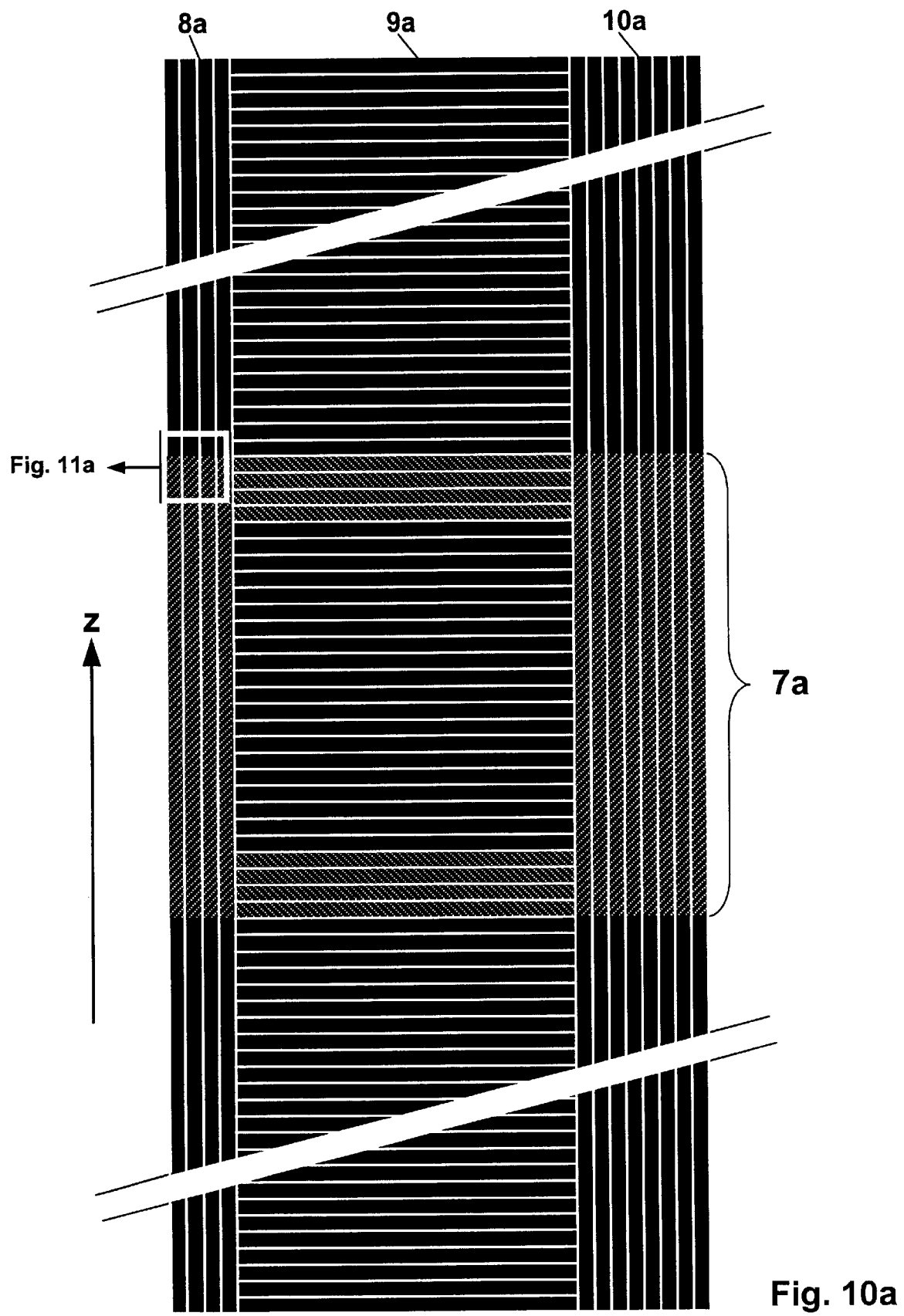
FIG. 10a is a superconducting conductor structure which has a constant width, is greatly extended in the z direction and is formed of three partial structures, two perpendicular and one horizontal. The RF resonator can be constructed with the hatched region. The other regions compensate for the magnetization produced by the RF resonator.

In the first embodiment of the inventive idea, the first Z structure consists of strips parallel to the $B_0$ field followed by a second structure with strips perpendicular to the $B_0$ field, which is again followed by a third structure with strips parallel to the $B_0$ field. FIG. 10a shows an example thereof, wherein the three Z structures are selected such that an RF resonator of the type of FIG. 10a in patent [6] can be produced therefrom. The region of the Z structures from which the RF resonator is to be produced is hatched in FIG. 10a (region 7a). The predominantly field-generating conductors are produced from the left Z structure 8a which is the closest to the measuring sample. The upper and lower transverse conductors are produced from the central structure 9a and the capacitive portions are produced from the right structure 10a. The right conductor structure 10a has twice as many conductors as the left conductor structure 8a to permit production of the capacitive portions.

The principal problem is production of the corners of the RF resonator located in the conductor structures 8a and 10a (FIG. 10a). This is solved by replacing certain regions of the individual current paths of the superconductor with small closed current paths S1, S3, S4, S5 and S6 (FIG. 11b) with the currents at the contacting lines between neighboring current paths being equal and opposite. Since the dimensions of these small current paths meet the conditions of finding 5, they can be rotated or displaced within the surface elements A2, B2, and C2 (FIG. 11b) without thereby influencing the $B_0$ field in the active measuring region. The individual steps for solving this problem are described in more detail below.

Figure 11A:
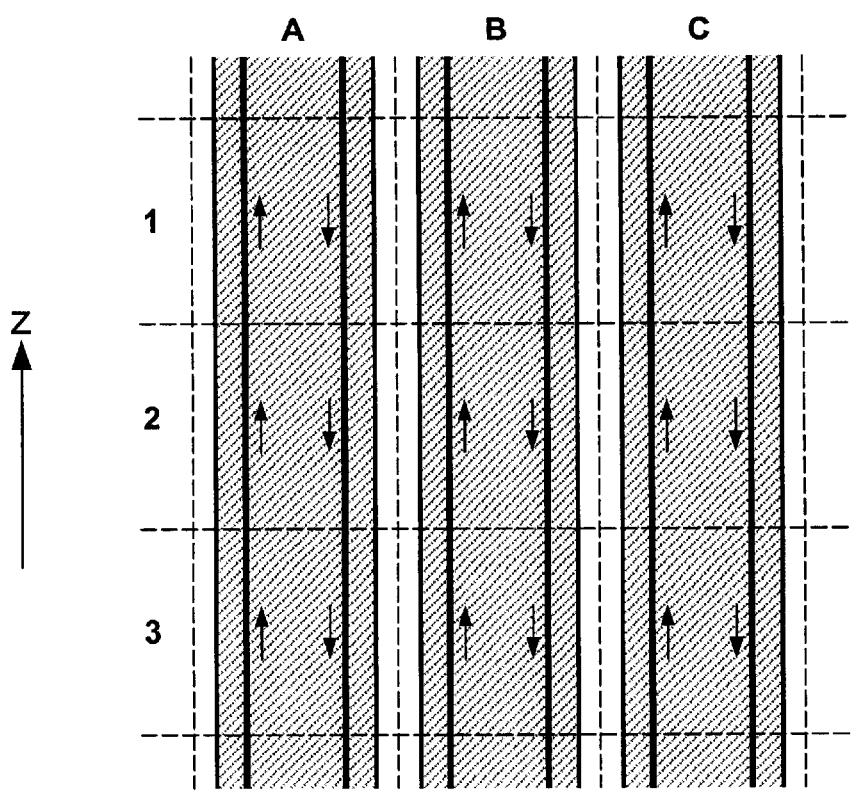
FIG. 11a is a partial section of the partial structure 8a of FIG. 10a. One individual closed current path is shown in each of the three vertical conductor strips which is cut off at the top and bottom and whose current direction is shown by arrows.
Figure 11B:
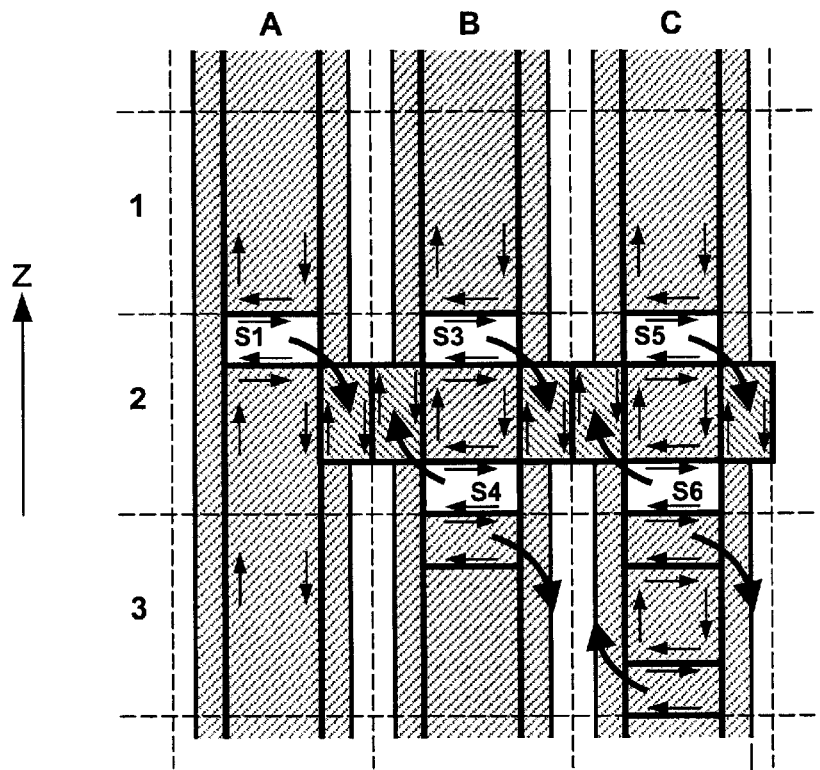
FIG. 11b shows the subdivision of the current loops in the conductor strips into further smaller current loops S1, S3, S4, S5 and S6 which are rotated through 90° in a clockwise direction to produce a current loop having a corner.
Figure 11C:
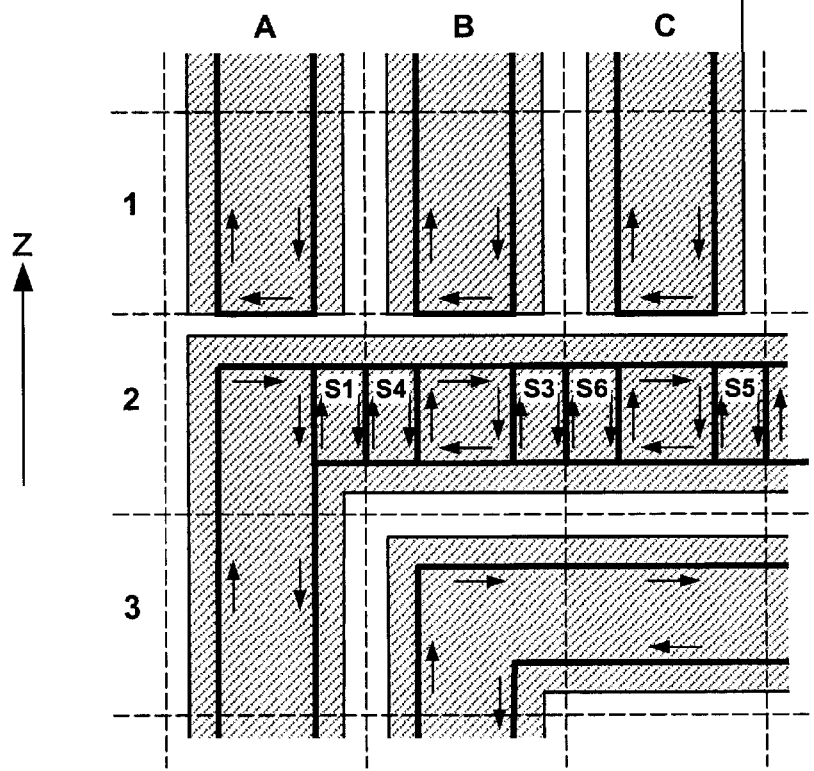
FIG. 11c shows the result of the transformation of FIG. 11b.

FIG. 11a shows a portion of the conductor structure 8a and consists of three vertical superconducting strips. One individual closed current path is shown on each strip. It is truncated at the top and bottom and the current flow direction is marked with arrows. The five current paths S1, S3, S4, S5, and S6 are rotated through 90° in a clockwise direction about the center of the associated surface element (FIG. 11b). This is also done with the small current paths in the surface elements B3 and C3. The result is current paths with one corner each (FIG. 11c).

This transformation was explained for one individual current path within the respective superconducting strip of FIG. 11a. It is valid for all possible current paths which can flow into the respective strip. Carrying out the described transformation for all possible current paths within the respective strips leads to the superconducting structure shown in FIG. 11c.

Figure 12A:
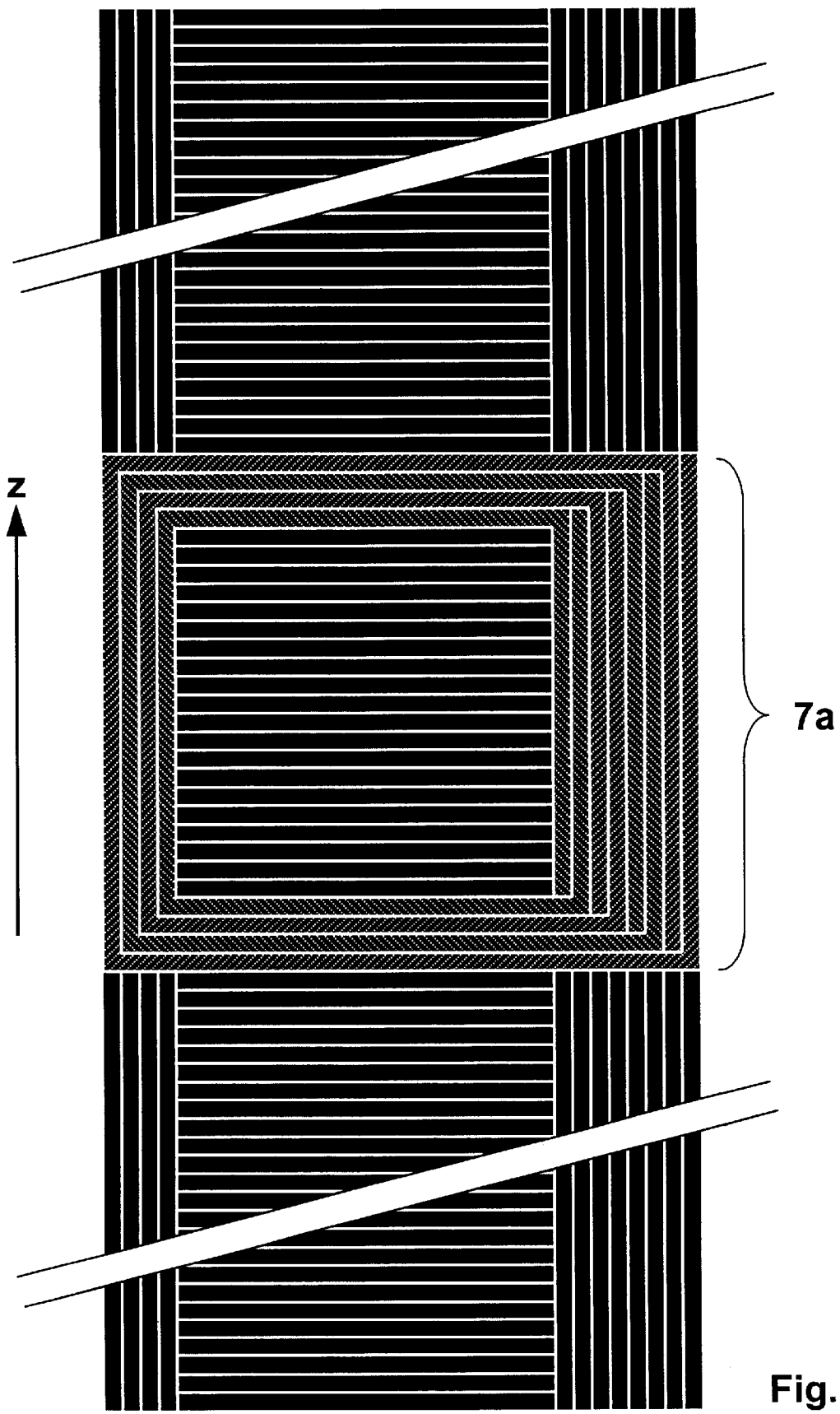
FIG. 12a shows the first embodiment of an inventive resonator produced from the hatched structure of FIG. 10a using the transformation of FIG. 11b. The region in which the RF current flows is hatched. The overall conductor structure produces nearly no z components in the active measuring region in the magnetized state.

After production of all corners in accordance with the described transformation, one obtains the overall structure of the RF resonator (hatched surface in FIG. 12a). It is nearly magnetically identical to the brightly marked surface of FIG. 10a and therefore does not produce any disturbing $B_z$ components in the active measuring region.

The conductor structure of FIG. 12a has the disadvantage that the RF field lines of the RF resonator must penetrate through a structure 9a of closely adjacent horizontal strips and meet strong resistance since only small gaps are provided for passage of the field lines. In particular, the horizontal strips which are surrounded by the RF resonator must permit passage of the highest concentration of field lines and therefore form the largest impediment.

Figure 10B:
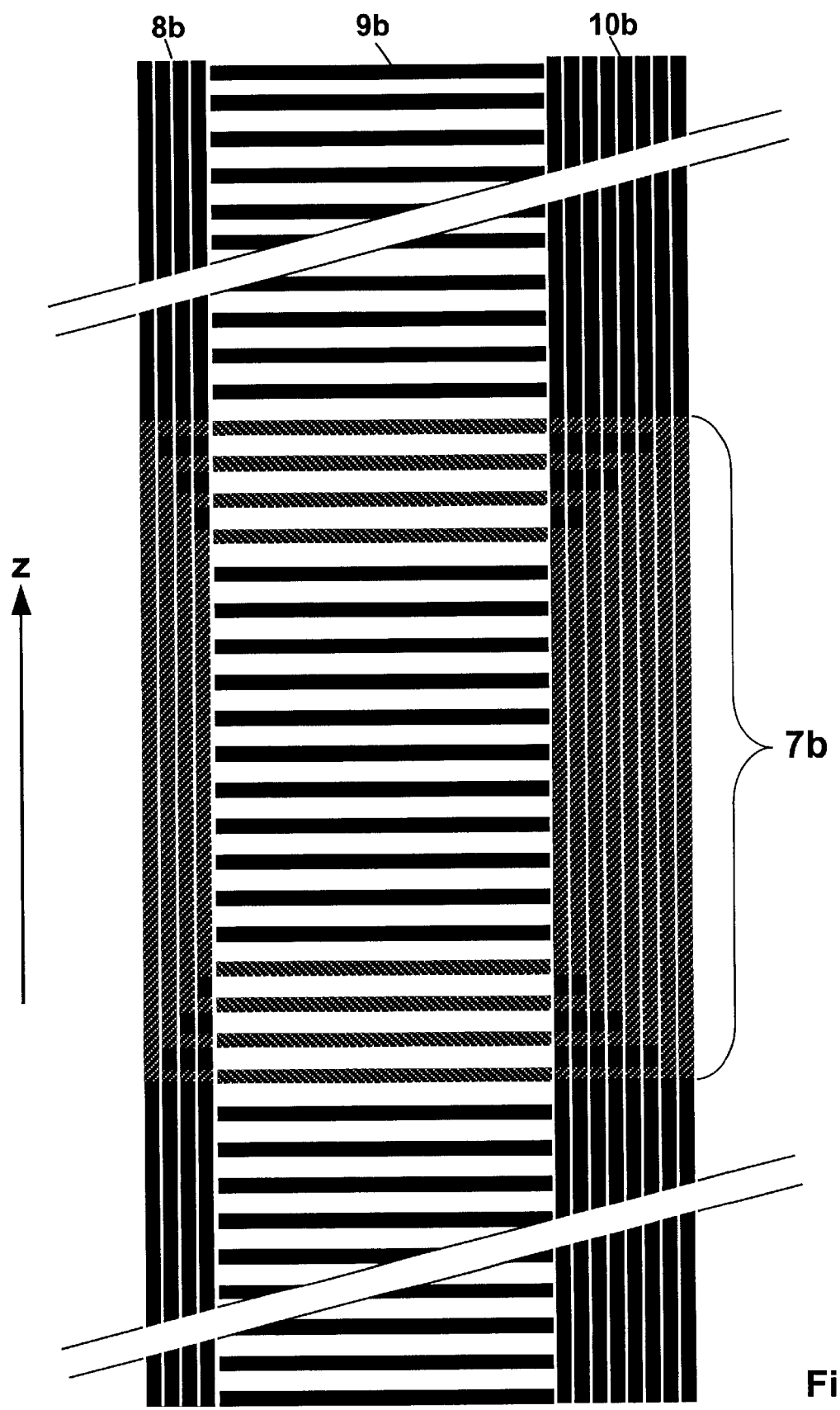
FIG. 10b is a superconducting conductor structure as in FIG. 10a, however with a central partial structure whose horizontal strips have a larger mutual separation. This partial structure improves the RF transparency.
Figure 12B:
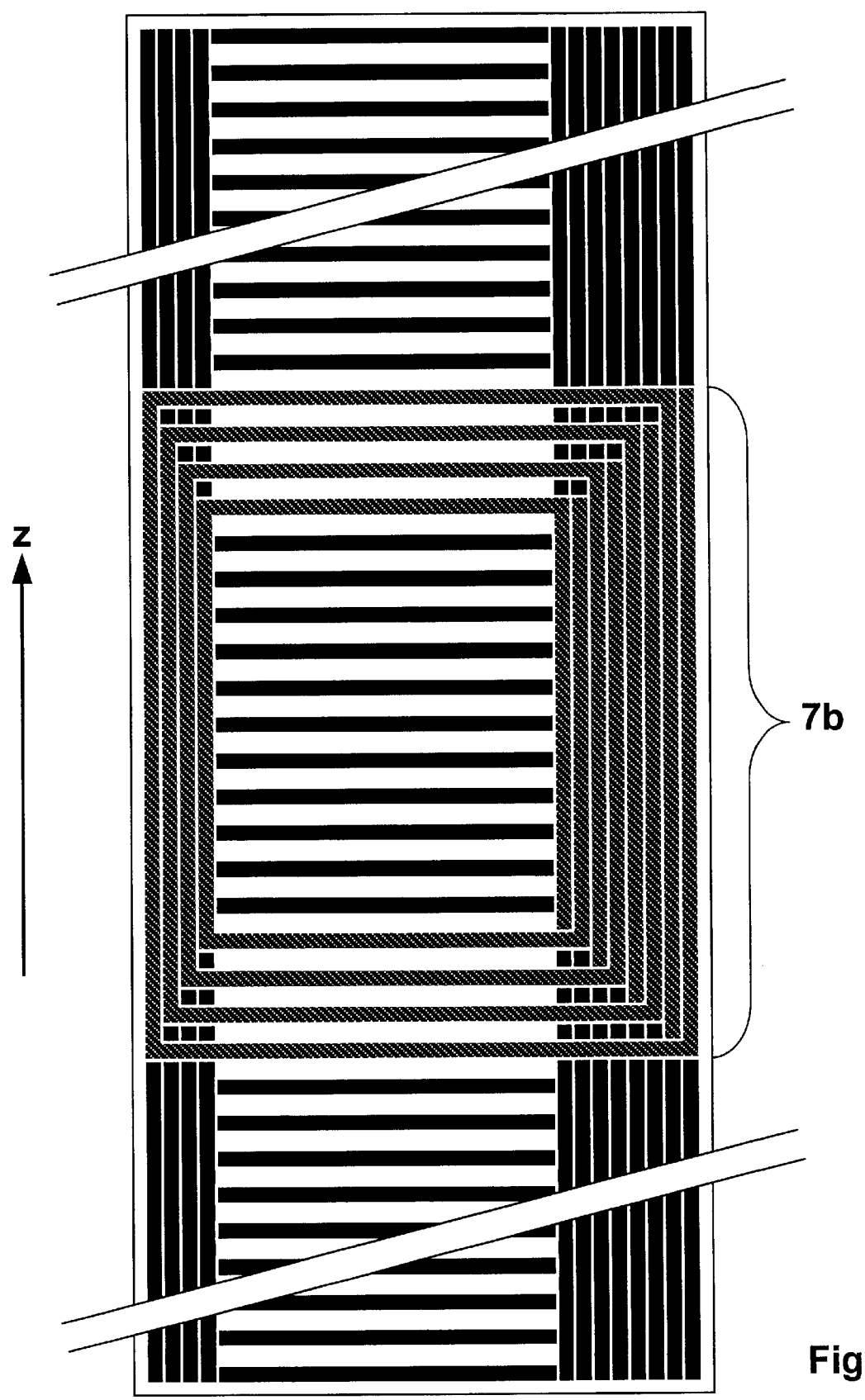
FIG. 12b shows the second embodiment of an inventive resonator which was produced from the hatched structure of FIG. 10b thereby using the transformation of FIG. 11b. The region in which the RF current flows is hatched. The overall conductor structure produces nearly no z components in the active measuring region in the magnetized state.

For this reason, in a second embodiment of the inventive idea, the central conductor structure 9a of FIG. 10a is replaced by the more transparent conductor structure 9b of FIG. 10b. Carrying out of the above-described transformation produces the structure of FIG. 12b which is substantially more transparent for RF field lines and therefore has better RF properties.

Examination of the two above-described embodiments for remaining error sources produces the two following findings:

1. The disturbing external field which acts on the superconductor must be sufficiently small that the working point is still within the linear region of the magnetization curve, i.e. there is a linear relation between current in the superconductor and disturbing field. If this is not the case, a possible anisotropy of the superconductor must be taken into consideration. Anisotropy means that currents which are parallel to the $B_0$ field have a different critical current density than those perpendicular to the $B_0$ field. This produces a different current distribution when the superconductor is rotated and therefore a different integral current value in the superconductor. Consequently, $B_0$ in the active measuring region changes in direct proportion to the change in this integral current value.

2. A further error is produced by the following. After rotation or displacement of the closed current paths, edge regions can be produced having currents concentrated on the edges of certain surface elements (see the currents on the lower edge of the surface elements A1, B1 and C1 in FIG. 11c) which of course cannot actually occur. Distribution of these edge currents over a certain area as is required for physical reasons to prevent infinitely high current densities at the edges leads to production of a small error.

Advantages of the Second Embodiment:

Many variations of the conductor structures are possible.
All conductor structures are located on one single substrate.

Disadvantages of the Second Embodiment:

If the superconductor is anisotropic, exact compensation is guaranteed only in the linear region of the magnetization curve, i.e. only with small disturbing fields.
Rotation of the small current loops produces minor errors in the edge regions of some superconducting strips.

Since mainly the anisotropy of the superconductor can produce significant disturbances, a third embodiment of the inventive idea presents a variant which omits rotation or displacement of current paths. Three Z structures are also used in this case. The two outer structures are formed with inclined strips according to FIG. 9f and the central one with horizontal strips according to FIG. 9c. The two outer conductor structures have the advantage that a portion of the conductors produce a galvanically coherent structure which extends in the z direction and at the same time permits connections at the edges of the two conductor structures. These connection possibilities permit direct connection to the horizontal strips of the central conductor structure without requiring previous rotation or displacement of current paths.

Figure 13:
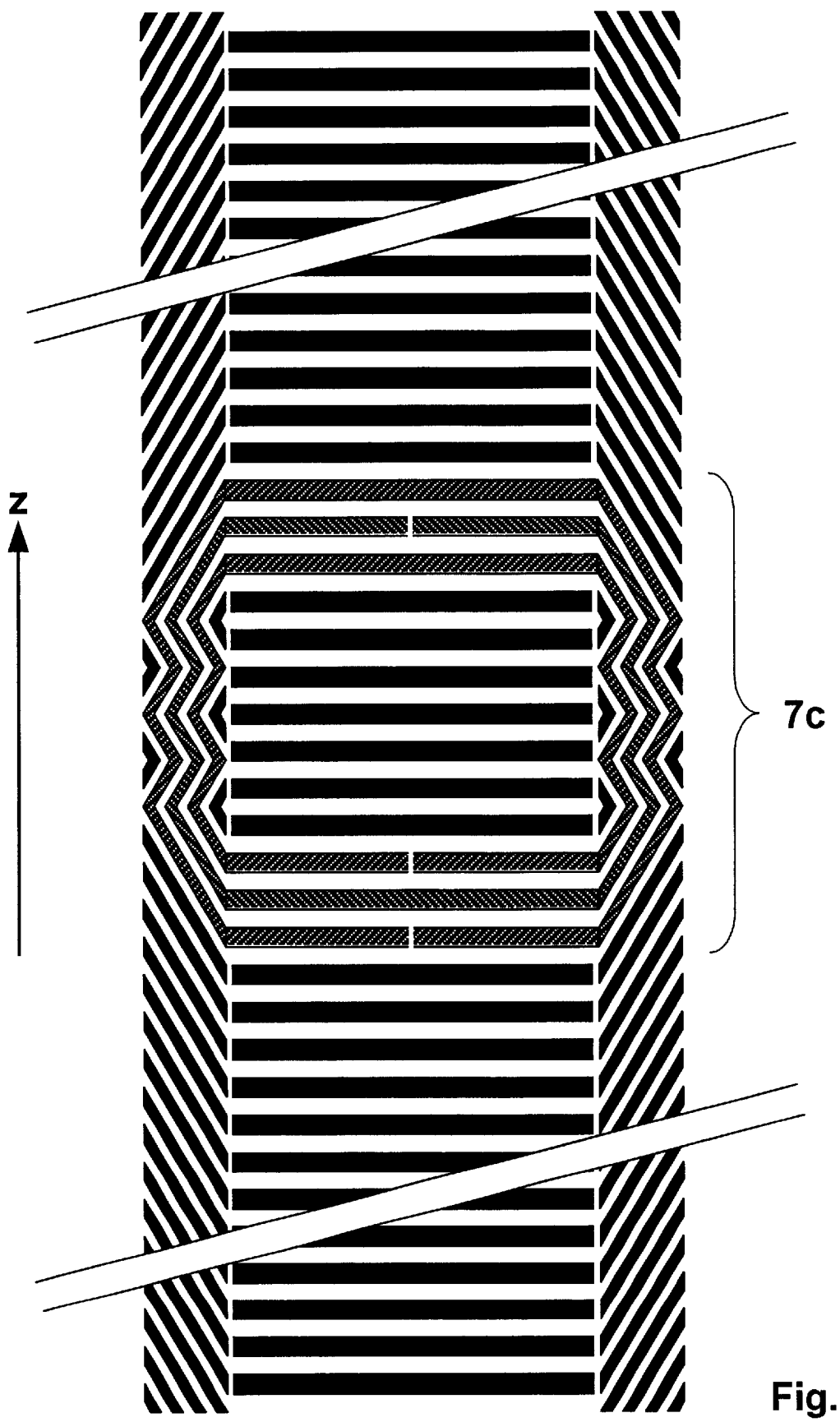
FIG. 13 shows the third embodiment of an inventive resonator directly produced from the three perpendicular partial structures (left, center and right in FIG. 13) without the need of rotating or displacing individual conductor parts. Some conductors had to be connected and/or disconnected over very short paths. The region in which the RF current flows is hatched. The overall conductor structure produces nearly no z components in the active measuring region in the magnetized state.

FIG. 13 shows an example thereof, wherein the conductor structures are selected such that an NMR resonator of the type of FIG. 2c in the patent [8] can be produced. The RF resonator has three conductor loops which are not completely closed but are each interrupted by a small separation thereby producing the capacitive portion of the resonator. The first and third conductor loop have the interruption in the lower transverse conductor, the central conductor loop in the upper transverse conductor. This third embodiment is very advantageous in that it is independent of the anisotropy of the superconductor.

Advantages of the Third Embodiment:

compensation is independent of the anisotropy of the superconductor
the entire conductor structure is located on one single substrate.

Disadvantages of the Third Embodiment:

the variation possibilities of the resonator are limited since part of the conductors must have a zig-zagged structure with connection possibilities at the edges of the associated compensated conductor structure.

Since the variation possibilities of the third embodiment are limited, a fourth embodiment of the inventive idea is presented which offers a considerably larger number of variations and still remains independent of the anisotropy of the superconductor. In this embodiment, the Z structures are suitably distributed on two different substrates. The two substrates are positioned one on top of the other such that the conductor structures disposed thereon come to rest close to each other and are separated e.g. only by a thin, electrically insulating sheet. In this fashion, all conductor structures are practically disposed on one plane.

The two substrates can also be disposed one on top of the other such that the conductor structures do not directly come to rest on top of each other but are separated by one of the two substrates. In this case the substrate which assumes the separating function should be as thin as possible to also ensure that all conductor structures are practically in one single plane.

As an example, an NMR resonator of the type of FIG. 10a of the patent [6] shall be constructed. It is also based on three Z structures, namely first and second vertical structures according to FIG. 14a and a third horizontal structure according to FIG. 14b, wherein the third structure is shown separately, but is disposed on top of the two first structures and exactly covers these.

The predominantly field-generating portions of the RF resonator are derived from the first conductor structure on the left in FIG. 14a, which is positioned closest to the measuring sample. The capacitive portions are derived from the right structure, with the right structure having twice as many conductors as the left to realize the capacitive portion.

The transverse connections of the RF resonator are derived from the third Z structure (FIG. 14b). The width $L_B$ of this Z structure equals the width $L_A$ of the two Z structures of FIG. 14a, i.e. the three Z structures exactly overlap one another.

Figures 15A, 15B:
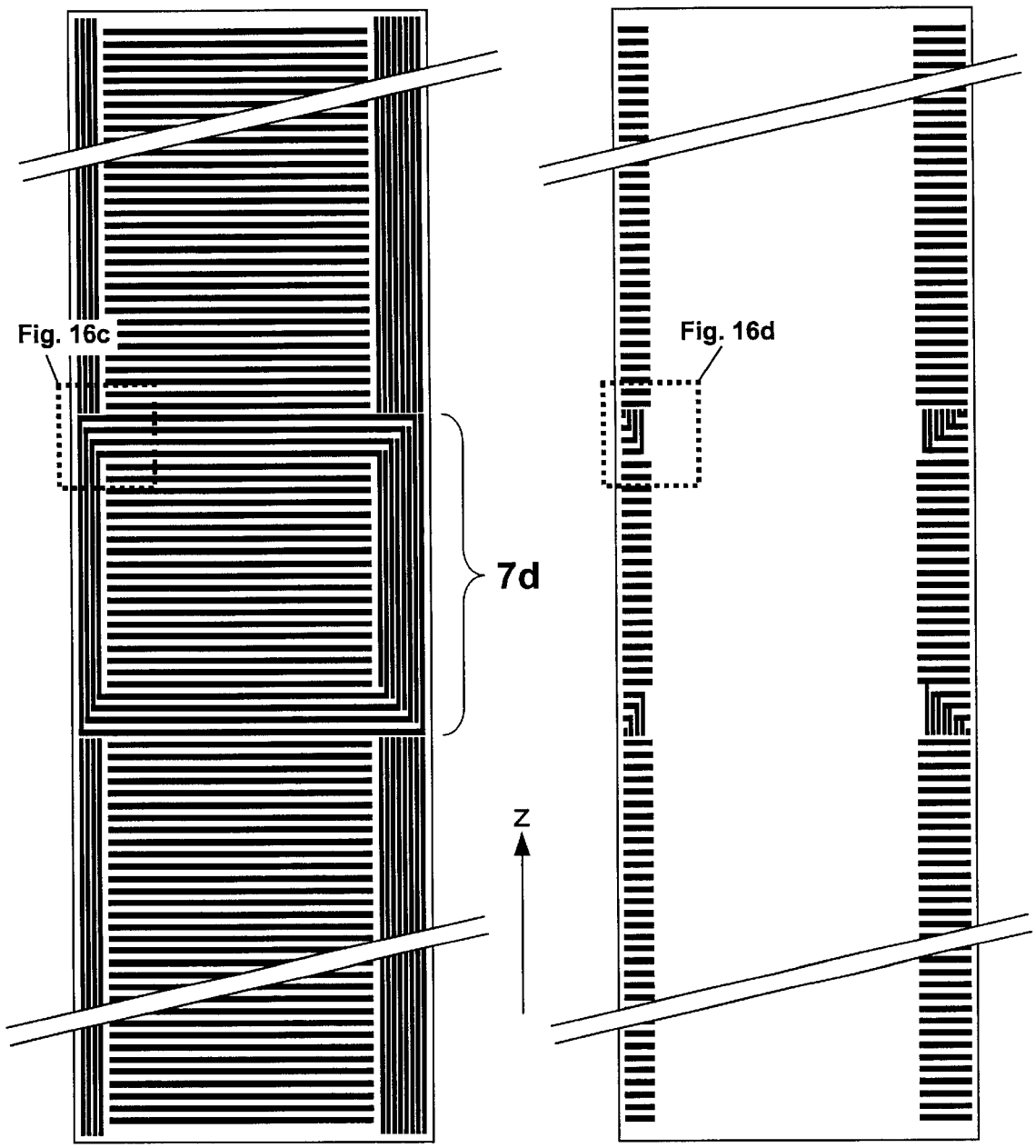
FIG. 15a shows a conductor structure on the first substrate of the fourth embodiment of an inventive resonator. The substrate contains the RF resonator 7d and the main portion of the conductor structures for compensating magnetism.
FIG. 15b shows a conductor structure on the second substrate of the fourth embodiment of an inventive resonator. This conductor structure compensates for the residual error of magnetism which could not be compensated for on the first substrate for technical reasons.
Figure 16A:
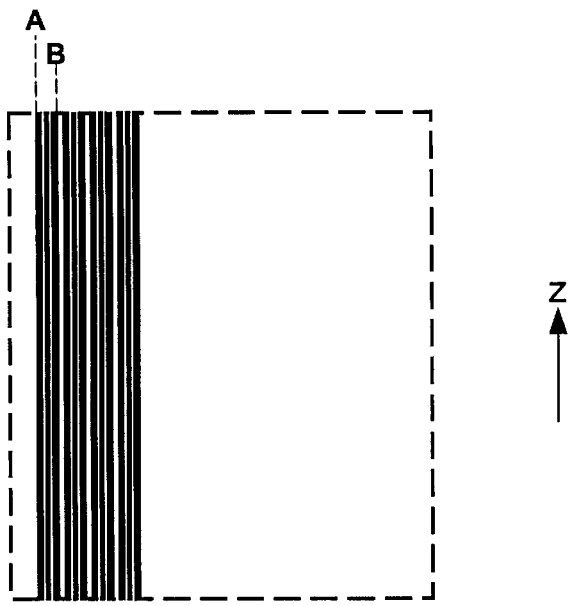
FIG. 16a shows a partial section of FIG. 14a. Three individual conductors are each combined into a bundle and represent one of the possible embodiments.
Figure 16B:
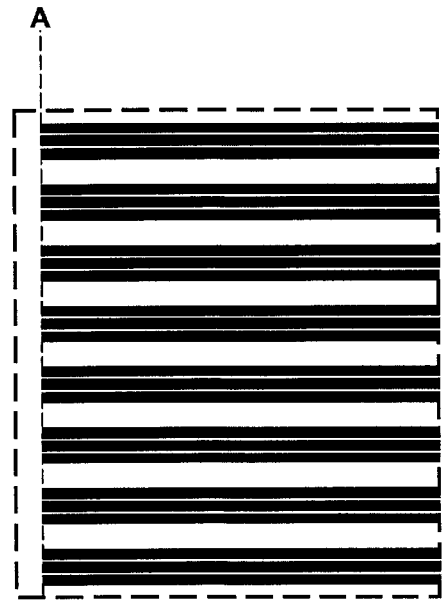
FIG. 16b shows a partial section of FIG. 14b. Three individual conductors are each combined into a bundle and represent one of the possible embodiments.
Figure 16C:
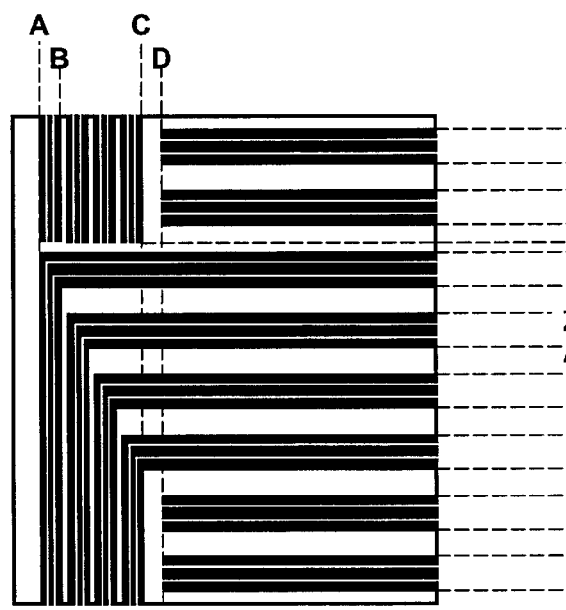
FIG. 16c shows a partial section of FIG. 15a. Three individual conductors are each combined into a bundle and represent one of the possible embodiments.
Figure 16D:
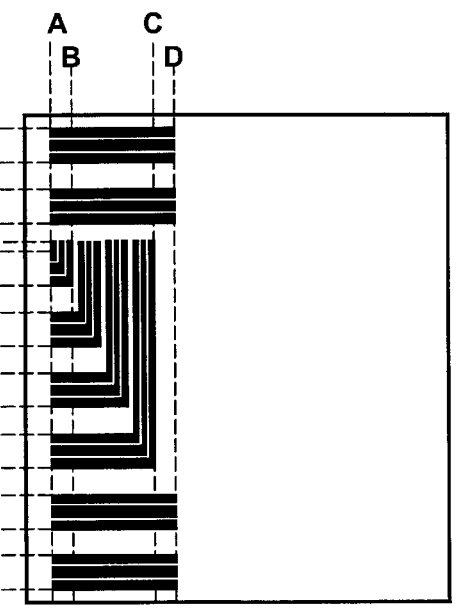
FIG. 16d shows a partial section of FIG. 15b. Three individual conductors are each combined into a bundle and represent one of the possible embodiments.
Figure 17A:
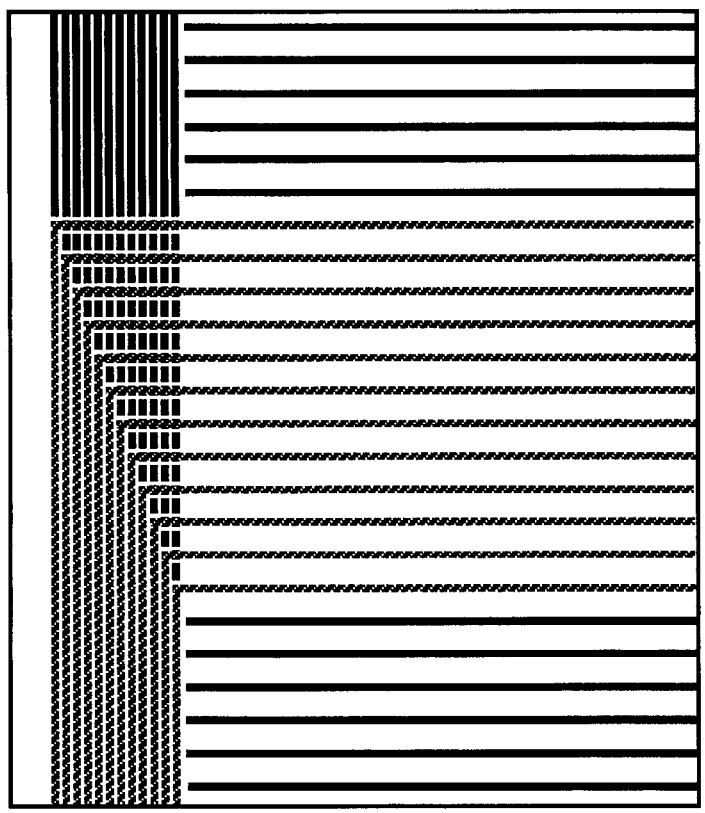
FIG. 17a shows part of a preferred NMR resonator wherein the individual conductors are not bundled. The hatched region belongs to the RF resonator.
Figure 17B:
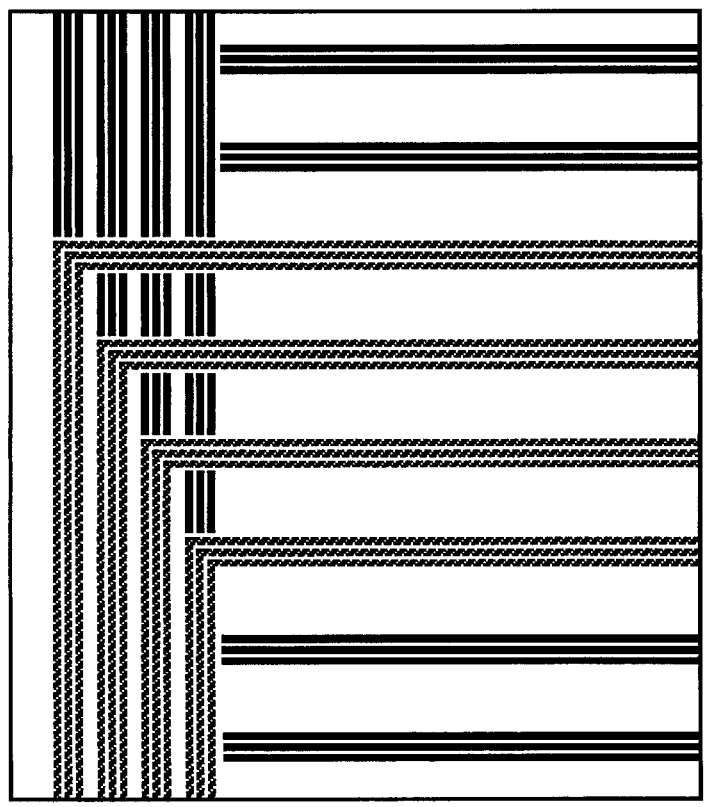
FIG. 17b shows part of an NMR resonator wherein three individual conductors have been combined into a bundle. The hatched region belongs to the RF resonator.

The three Z structures are decomposed and distributed onto the two substrates such that, on each individual substrate, none of the conductors overlap or cross each other and that, in total, a resonant RF resonator is produced. The first substrate has the structure of FIG. 15a, i.e. the RF resonator and the main portion of the conductor structures for compensating magnetization, and the second substrate has the structure of FIG. 15b for compensating the residual part of the magnetization. It is thereby important that the sum of the structures of FIGS. 15a and 15b is as close to the sum of the Z structures of FIGS. 14a and 14b as possible, since only then is the two substrate resonator magnetically identical to the original three Z structures of FIGS. 14a and 14b which do not produce any $B_z$ components in the active measuring region.

Advantages of the Fourth Embodiment:

compensation does not depend on the anisotropy of the superconductor.
many variations of the conductor structures are possible.

Disadvantage of the Fourth Embodiment:

two individual substrates or one substrate which is covered on both sides are required whose structures must be positioned exactly on top of each other.

All procedures are now summarized with which the RF resonator can be built from the desired regions of the Z structures. The following procedures can be applied individually, in groups or all at the same time:

1. Rotating or displacing superconducting parts within small surface elements.
2. Bridging of small gaps with a superconductor.
3. Provision of small interruptions.
4. Use of Z structures which have inclined and zig-zag shaped conductors.
5. Disassembling the Z structures and redistributing them onto two substrates to prevent overlappings or crossings on one individual substrate.

Figure 1:
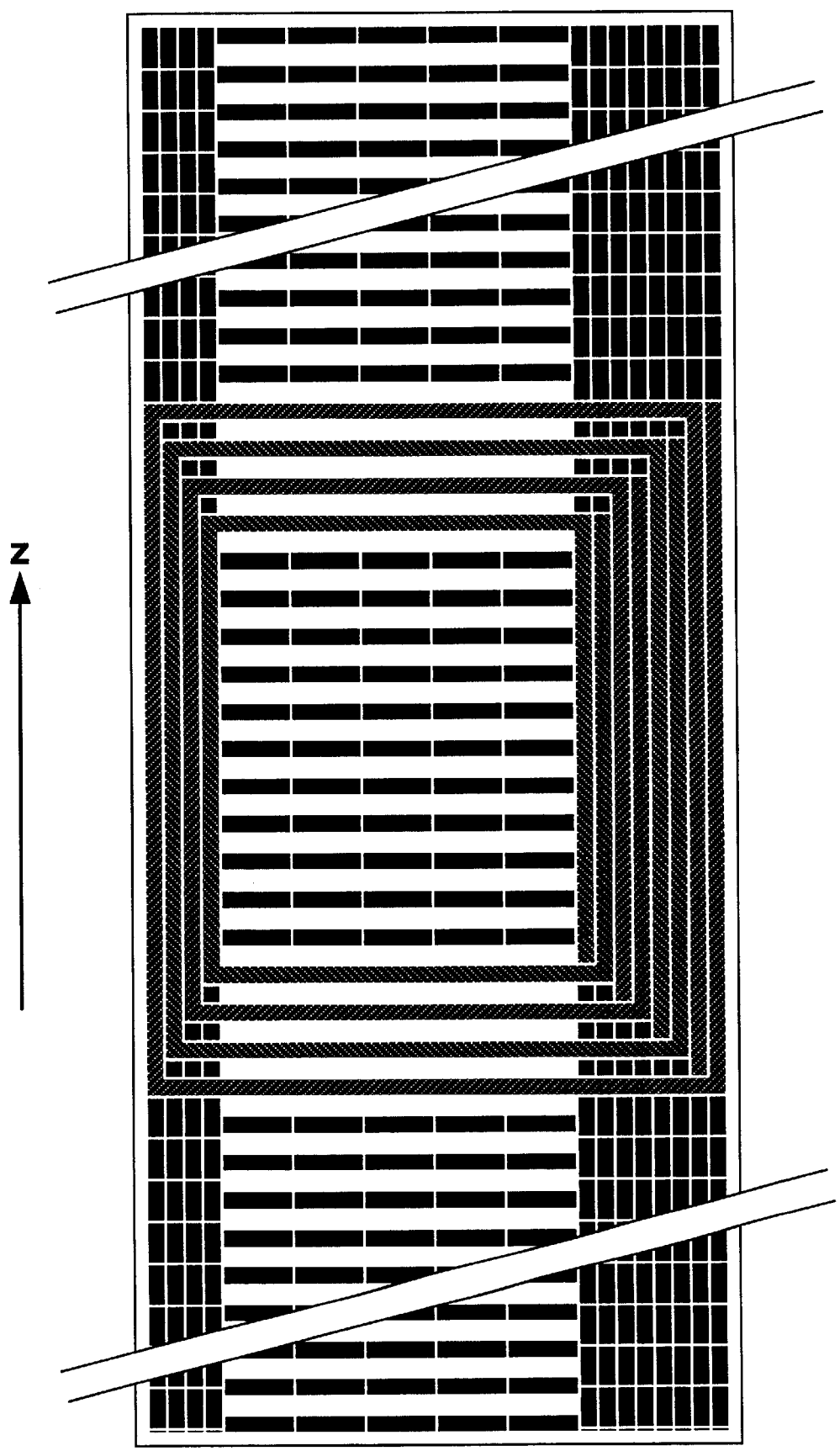
FIG. 1 shows a modified second embodiment of the inventive resonator. It is practically identical with that of FIG. 12b, but has small interruptions in the additional conductors compensating for magnetization, to minimize RF coupling between these conductors and the actual RF resonator (marked with hatched lines).

The superconducting conductors which do not belong to the RF resonator can be additionally provided with narrow interruptions to minimize the RF coupling to the RF resonator. Such interruptions are shown in FIG. 1 for the second embodiment. They can be realized in all other embodiments, although not explicitly shown therein.

NMR resonators whose components have a magnetic susceptibility which differs from the surroundings, generally produce field inhomogeneities in the active measuring region. Conventionally, this effect is compensated for by supplementing the components with additional materials having the same susceptibility as the components and with sufficient extension parallel to the z direction. The additional materials are insulators which can e.g. include a liquid in which the entire coil is immersed. This method is referred to as the "susceptibility continuation method" and differs as follows from the present invention:

1. The "susceptibility continuation method" was used only for normally conducting metals or insulators and is generally only useful for these. With superconductors, the magnetization effects are generally stronger and require other compensation methods, e.g. those in accordance with the present invention.
2. With normally conducting materials, magnetization is produced by magnetic dipole moments within the components which are inevitably oriented by the $B_0$ field parallel thereto. With a superconductor, however, magnetization is produced by compensation currents in the superconducting components. The influence of these currents on the field homogeneity in the active measuring region can be orders of magnitude larger than the influence of the magnetic dipole moments.
3. In the "susceptibility continuation method" only the longitudinal magnetization of the components must be compensated for, the transverse magnetization is negligibly small. In the superconductor, however, the transverse magnetization is dominant and the longitudinal magnetization is of only minor importance.

The literature [7] moreover discloses a method with which the susceptibility of an NMR resonator is at least partially compensated for to minimize the influence on the NMR spectrum. This method also only refers to normally conducting materials and eliminates the field disturbances only on the z axis and not in the entire active measuring region. In contrast thereto, the present invention compensates for the field disturbances throughout the entire active measuring region.

List of References for the Drawings

Letters:

$B_0$ static magnetic field of the NMR magnet.

$\Delta B$ field which is generated by the magnetized superconductor.

$(\Delta B_z)_1$ z-component of $\Delta B$ for one single superconducting strip 2 or 4.

$(\Delta B_z)_{tot}$ z-component of $\Delta B$ for the arrangement 5 which is composed of several superconducting strips.

S1, S3, S4, S5, S6 individual closed current paths in the superconducting strips.

Numbers:

1 active measuring volume 2 long flat conductor of superconducting material (superconducting strip) whose longitudinal axis is parallel to $B_0$ 3 currents in the superconducting strip 2

4 flat conductor of superconducting material (superconducting strip) whose longitudinal axis is perpendicular to $B_0$ 4a, 4b, 4c, . . . 4k superconducting strips as described in 4 which belong to the arrangement of 5

5 arrangement of several superconducting strips 4a, 4b, 4c, . . . 4k which are on a plane parallel to $B_0$ and disposed uniformly on top of each other 6 currents in the superconducting strip 4

7a, 7b, 7c, 7d regions of the different resonators in which the conductor sections are disposed which carry RF currents. These conductor sections define the RF resonators, i.e. the RF resonant circuits 8a, 8b vertical conductor structure parallel to the z axis which is partially used to produce the vertical conductor portions of the resonator which are located closest to the sample volume and which produce the main portion of the RF field at that location 9a, 9b horizontal conductor structure perpendicular to the z axis which is partially used to produce the horizontal transverse connections at the top and bottom of the RF resonator 10a, 10b perpendicular conductor structure parallel to the z axis which is partially used to produce the capacitive portions of the RF resonator.

References

[1] U.S. Pat. No. 5,619,140
[2] WO 99/24845
[3] WO 99/24821
[4] U.S. Pat. No. 5,572,127
[5] DE 197 33 574 A1
[6] DE 101 18 835.8-33
[7] DE 34 14 559 A1
[8] WO 96/39636
[9] U.S. Pat. No. 5,565,778
[10] U.S. Pat. No. 6,025,719

I claim:

1. A NMR (nuclear magnetic resonance) resonator system for emitting and/or receiving RF signals at one or more desired resonance frequencies to and/or from a measuring sample in an NMR apparatus investigational volume disposed about a coordinate origin (x,y,z=0), the NMR apparatus having means for producing a homogeneous magnetic field $B_0$ in the direction of a z axis, the resonator system comprising:

at least one RF (radio frequency) resonator having superconducting conductor structures which act inductively and, to a certain extent, also capacitively which are disposed between $z=-|z_1|$ and $z=+|Z_2|$ substantially on a surface which is translation-invariant (=z-invariant) in a z direction at a radial (x,y) separation from the measuring sample; and a compensation arrangement disposed on a z-invariant surface to extend to values of at least $z<-|z_1|-0.5|r|$ and $z>+|z_2|+0.5|r|$, wherein $|r|$ is a minimum separation between the measuring sample and said compensation arrangement, wherein said compensation arrangement has further superconducting conductor structures which are largely RF-decoupled from said RF resonator, said conductor structures of the compensation arrangement and of said RF resonator being composed of individual surface sections ("Z-structures") which comprise superconducting structures disposed in said z-invariant surface to each extend across an entire length in said z direction of said conductor structures of said compensation arrangement and of said RF resonator and whose superconducting structures are disposed such that, with suitable conceptual decomposition of a surface of said Z structures into a plurality of small, equally sized surface elements and with conceptual application of a homogeneous test magnetic field along a surface normal of each surface element, a magnetic dipole moment of essentially a same strength would be induced in all those surface elements which differ only with respect to their z position.

2. The NMR resonator system of claim 1, wherein all surface elements which differ only with respect to their z position contain substantially equal amounts of superconducting material.

3. The NMR resonator system of claim 1, wherein a total number of said surface elements is larger than 50.

4. The NMR resonator system of claim 3, wherein said total number of said surface elements is larger than 200.

5. The NMR resonator system of claim 1, wherein a number of said surface elements which differ with respect to their z position only is larger than 20.

6. The NMR resonator system of claim 5, wherein said number of said surface elements which differ with respect to their z position only is larger than 50.

7. The NMR resonator system of claim 1, wherein said superconducting conductor structures of said compensation arrangement project past both sides of the RF resonator by at least half.

8. The NMR resonator system of claim 7, wherein said superconducting conductor structures of said compensation arrangement project past both sides of said RF resonator by approximately twice an extension of said RF resonator in the z direction.

9. The NMR resonator system of claim 1, further comprising several of said resonator and said compensation arrangements, wherein said several said RF resonator and said compensation arrangements are RF-coupled to each other and lie on different partial surfaces of said z-invariant surface.

10. The NMR resonator system of claim 9, wherein said several of said RF resonator and said compensation arrangement comprise two of said RF resonator and said compensation arrangements.

11. The NMR resonator system of claim 9, wherein said several of said RF resonator and said compensation arrangement comprise 4 of said RF resonator and said compensation arrangements.

12. The NMR resonator system of claim 1, wherein said superconducting conductor structures of said RF resonator which act inductively and partially also capacitively, and said superconducting conductor structures of said compensation arrangement, are disposed on flat substrate elements which are disposed parallel to each other and to the z axis.

13. The NMR resonator system of claim 1, wherein said superconducting conductor structures of said RF resonator which act inductively and partially also capacitively and said superconducting conductor structures of an associated compensation arrangement are disposed in a same plane.

14. The NMR resonator system of claim 1, wherein said superconducting structures of said RF resonator and of said associated compensation arrangement are disposed in at least two flat partial surfaces which are arranged parallel to each other, wherein said superconducting conductor structures of said RF resonator which act inductively and partially also capacitively, and parts of associated superconducting conductor structures of said compensation arrangement are disposed in a first partial surface, and the remaining parts of said superconducting conductor structures of said compensation arrangement are disposed in other partial surfaces.

15. The NMR resonator system of claim 14, wherein separations between said partial surfaces, measured in a direction perpendicular to said partial surfaces, are not more than 600 $\mu$m.

16. The NMR resonator system of claim 15, wherein said separations are between 50 and 200 $\mu$m.

17. The NMR resonator system of claim 1, wherein said superconducting conductor structures of said RF resonator which act inductively and partially also capacitively, and said superconducting conductor structures of said compensation arrangement are disposed on substrate elements which are cylindrically curved about the z direction.

18. The NMR resonator system of claim 1, wherein said superconducting conductor structures of said compensation arrangement and of said RF resonator are disposed on a same partial surface of said z-invariant surface.

19. The NMR resonator system of claim 1, wherein at least part of said superconducting sections of said conductor structures is disposed in strips which are one of parallel and perpendicular to the z direction.

20. The NMR resonator system of claim 1, wherein superconducting structures on said z-invariant surfaces are composed of different geometrical shapes, which are at least one of strips of different orientation, strips of different width, squares, circles and trapezoids.

21. The NMR resonator system of claim 1, wherein at least one of said Z structures is built from identical, narrow superconducting structural elements and these structural elements consist of one single conductor or of conductors disposed in groups, which are disposed in close proximity and with periodic continuity in the z direction, wherein a separation between neighboring structural elements is small compared to a separation from a center of said investigational of volume.

22. The NMR resonator system of claim 1, wherein at least one of said Z structures is composed of structural elements which consist of one individual conductor or of conductors disposed in groups, wherein conductor sections are oriented parallel to the z axis and have one of identical and different mutual separations.

23. The NMR resonator system of claim 1, wherein at least one of said Z structures is divided into several partial regions whose width is equal to a width of a respective said Z structure and that these partial regions are filled by straight superconducting strips which are inclined by a desired angle relative to the z axis, wherein said angle is one of positive and negative within a partial region, wherein said inclined strips are disposed with close proximity and periodic continuity in the z direction within one partial region, a separation between neighboring strips being small compared to a separation from a center of said investigational volume and said inclined strips merging continuously at border lines between said partial regions.

24. The NMR resonator system of claim 1, wherein superconducting conductor structures which do not belong to said RF resonator contain a number of narrow interruptions which are distributed over at least portions of an entire length of individual superconducting conductor sections.

25. The NMR resonator system of claim 1, wherein said RF resonator is produced from desired regions of said Z structures by performing at least one of the following operations: rotating at least parts of superconductor within small surface elements of said Z structures, displacing at least parts of superconductor within small surface elements of said Z structures, superconductingly connecting small separations between conductors, disposing narrow interruptions in conductors, using zig-zag shaped and inclined Z structures, and distributing said Z structures on at least two partial surfaces.

26. The NMR resonator system of claim 1, wherein three of said Z structures are used, two said Z structures with vertical strips on a left and a right and one said Z structure with horizontal straight strips in a center.

27. The NMR resonator system of claim 1, wherein three of said Z structures are used, two of said Z structures with inclined, partially zig-zag shaped strips on a left and on a right, and one central said Z structure having transverse strips periodically disposed in the z direction.

28. The NMR resonator system of claim 1, wherein three of said Z structures are used, a first and second Z structure having a defined mutual separation and each comprising strips disposed parallel to the z axis and a third Z structure with strips disposed periodically in z and transverse to the z axis, wherein said third Z structure is positioned above said first two Z structures and covers them in a precise fashion and wherein said RF resonator and said compensation structure are generated by partially decomposing said three z structures and redistributing them over two separate partial surfaces which belong to one or two substrates, wherein a first partial surface contains an entire said RF resonator and a main part of said compensation structure, with a second partial surface containing a remaining part of said compensation structure, with structures produced in this fashion being positioned on said two partial surfaces such that a sum of their structures is equal to said sum of said original three Z structures to produce an operative NMR resonator.

29. The NMR resonator system of claim 1, wherein at least parts of said superconducting conductor structures contain a high temperature superconducting material.

30. The NMR resonator system of claim 1, wherein said superconducting conductor structures are formed from one of thin layers and layers having a thickness between 0.1 and 1 $\mu$m.

* * * * *